United States Patent
Chen et al.

(10) Patent No.: US 12,027,435 B2
(45) Date of Patent: Jul. 2, 2024

(54) PACKAGES INCLUDING MULTIPLE ENCAPSULATED SUBSTRATE BLOCKS AND OVERLAPPING REDISTRIBUTION STRUCTURES

(71) Applicant: Taiwan Semiconductor Manufacturing Co., Ltd., Hsinchu (TW)

(72) Inventors: Chen-Shien Chen, Zhubei (TW); Kuo-Ching Hsu, Chung-Ho (TW); Wei-Hung Lin, Xinfeng Township (TW); Hui-Min Huang, Taoyuan (TW); Ming-Da Cheng, Taoyuan (TW); Mirng-Ji Lii, Sinpu Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/818,742

(22) Filed: Aug. 10, 2022

(65) Prior Publication Data

US 2022/0384287 A1 Dec. 1, 2022

Related U.S. Application Data

(62) Division of application No. 17/318,703, filed on May 12, 2021, now Pat. No. 11,842,935.

(Continued)

(51) Int. Cl.
*H01L 23/31* (2006.01)
*H01L 21/56* (2006.01)
(Continued)

(52) U.S. Cl.
CPC .......... *H01L 23/3114* (2013.01); *H01L 21/56* (2013.01); *H01L 23/5384* (2013.01); *H01L 24/81* (2013.01)

(58) Field of Classification Search
CPC . H01L 21/56; H01L 21/4857; H01L 21/6835; H01L 23/3114; H01L 23/3121;
(Continued)

(56) References Cited

U.S. PATENT DOCUMENTS 8,643,148 B2 * 2/2014 Lin .................... H01L 25/50
257/620
9,048,222 B2 * 6/2015 Hung ................ H01L 23/5384
(Continued)

FOREIGN PATENT DOCUMENTS

DE 102019117006 A1 1/2020
KR 20160111308 A 9/2016
(Continued)

*Primary Examiner* — Khiem D Nguyen
(74) *Attorney, Agent, or Firm* — Slater Matsil, LLP

(57) ABSTRACT

A method includes forming a reconstructed package substrate, which includes placing a plurality of substrate blocks over a carrier, encapsulating the plurality of substrate blocks in an encapsulant, planarizing the encapsulant and the plurality of substrate blocks to reveal redistribution lines in the plurality of substrate blocks, and forming a redistribution structure overlapping both of the plurality of substrate blocks and encapsulant. A package component is bonded over the reconstructed package substrate.

20 Claims, 27 Drawing Sheets

Related U.S. Application Data

(60) Provisional application No. 63/150,725, filed on Feb. 18, 2021.

(51) Int. Cl.
    *H01L 23/00* (2006.01)
    *H01L 23/538* (2006.01)

(58) Field of Classification Search
    CPC ............. H01L 23/5383; H01L 23/5384; H01L 23/5385; H01L 23/5389; H01L 24/16; H01L 24/81; H01L 24/97; H01L 2221/68345; H01L 2221/68359; H01L 2221/68368; H01L 25/0652
    USPC ........................................................ 257/774
    See application file for complete search history.

(56) References Cited

U.S. PATENT DOCUMENTS

| | | | |
|---|---|---|---|
| 9,111,949 B2 | 8/2015 | Yu et al. | |
| 9,781,843 B2 | 10/2017 | Hu et al. | |
| 9,837,359 B1* | 12/2017 | Chiu | .................. H01L 21/4857 |
| 10,217,702 B2 | 2/2019 | Lin et al. | |
| 10,510,674 B2* | 12/2019 | Lin | ......................... H01L 24/73 |
| 10,707,177 B2 | 7/2020 | Huang et al. | |
| 10,854,552 B2 | 12/2020 | Wu et al. | |
| 11,004,803 B2 | 5/2021 | Yu et al. | |
| 11,018,091 B2 | 5/2021 | Chen et al. | |
| 11,018,113 B2* | 5/2021 | Chuang | ............... H01L 23/5385 |
| 11,133,282 B2 | 9/2021 | Yu et al. | |
| 2010/0327424 A1 | 12/2010 | Braunisch et al. | |
| 2012/0241927 A1 | 9/2012 | Koo et al. | |
| 2016/0056087 A1 | 2/2016 | Wu et al. | |
| 2017/0170128 A1 | 6/2017 | Chen et al. | |
| 2017/0250138 A1* | 8/2017 | Hsieh | .................. H01L 21/4857 |
| 2017/0338202 A1* | 11/2017 | Tsai | ....................... H01L 24/19 |
| 2017/0345731 A1* | 11/2017 | Chiang | ............... H01Q 21/065 |
| 2019/0148301 A1* | 5/2019 | Huang | ............... H01L 23/5385 257/774 |
| 2019/0148305 A1 | 5/2019 | Lin et al. | |
| 2020/0106156 A1* | 4/2020 | Lu | ........................... H01L 24/19 |
| 2020/0381391 A1* | 12/2020 | Yu | ........................... H01L 25/50 |
| 2021/0225780 A1* | 7/2021 | Wu | .................. H01L 23/49816 |

FOREIGN PATENT DOCUMENTS

| | | |
|---|---|---|
| KR | 20200003706 A | 1/2020 |
| KR | 20200138636 A | 12/2020 |
| TW | 201318129 A | 5/2013 |
| TW | M455255 U | 6/2013 |

* cited by examiner

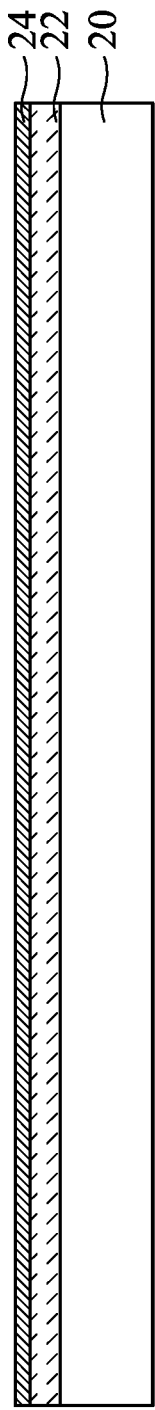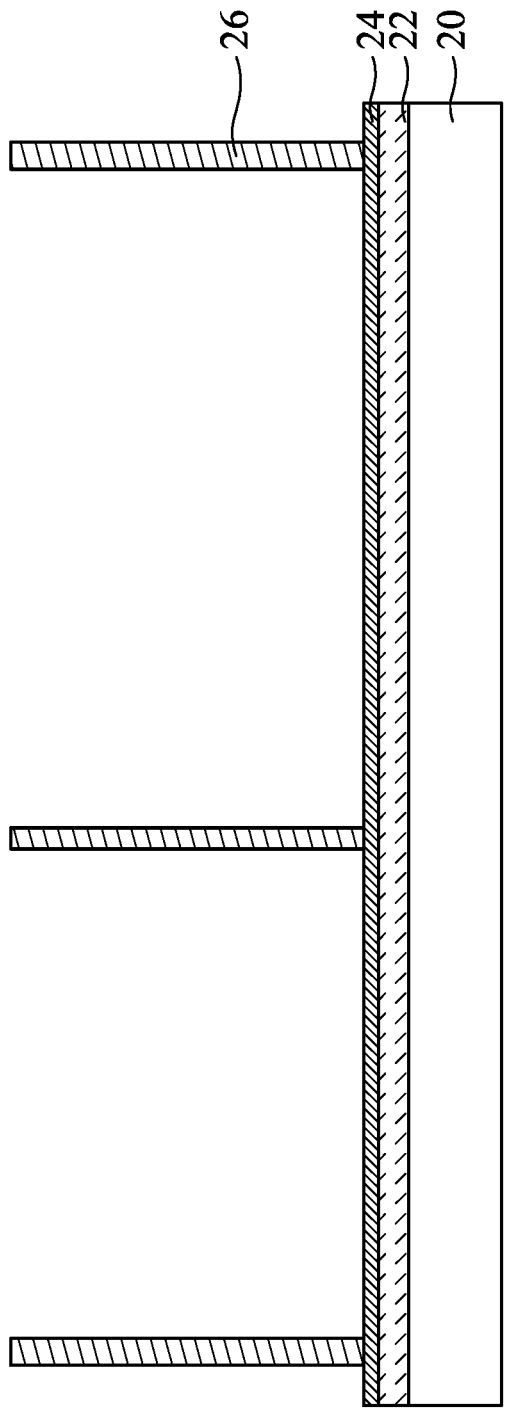
FIG. 2
FIG. 3

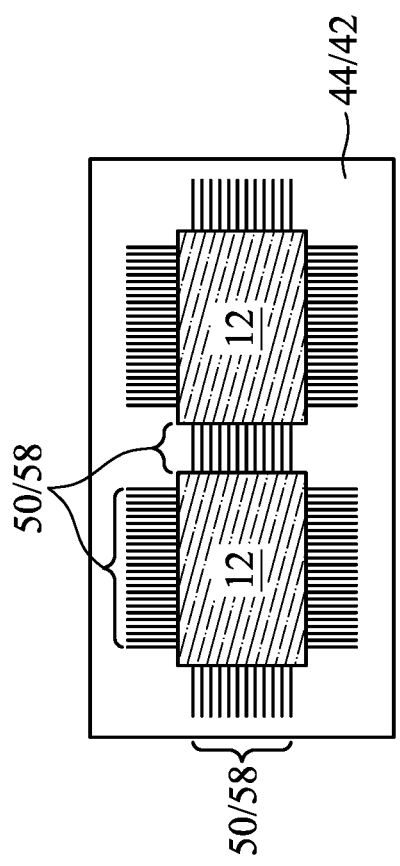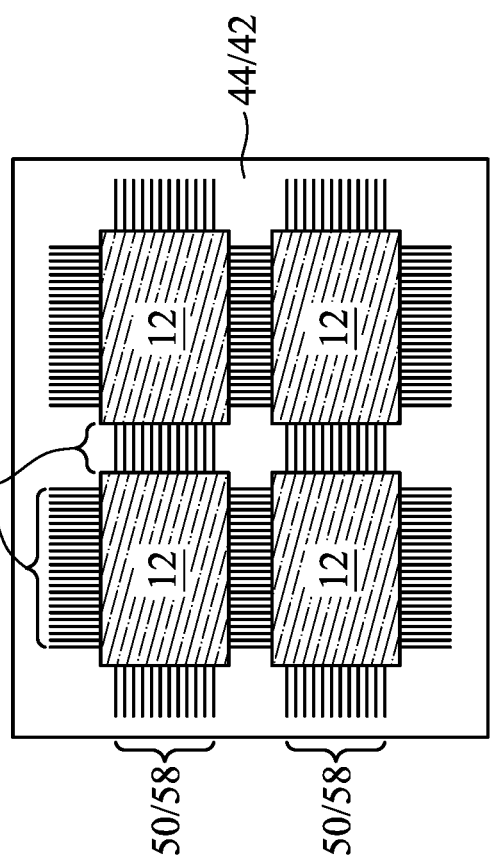

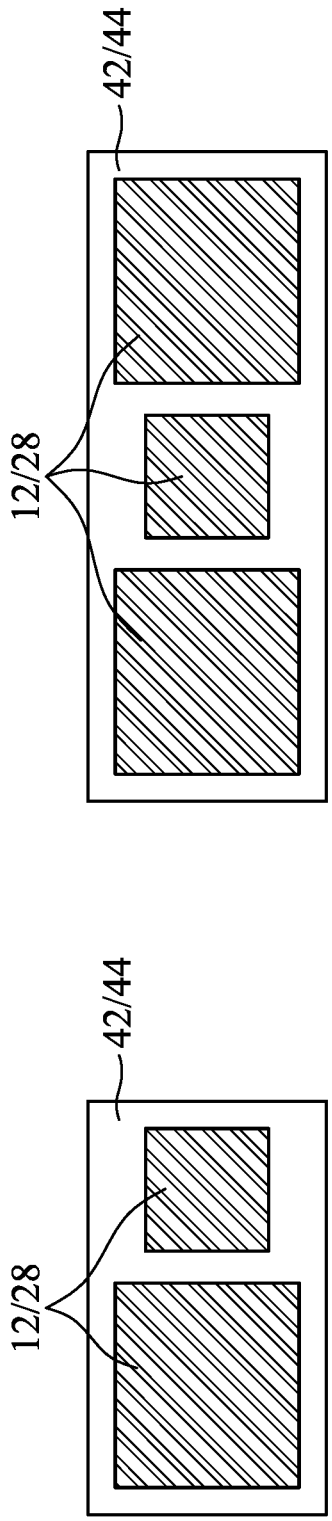
FIG. 21
FIG. 22
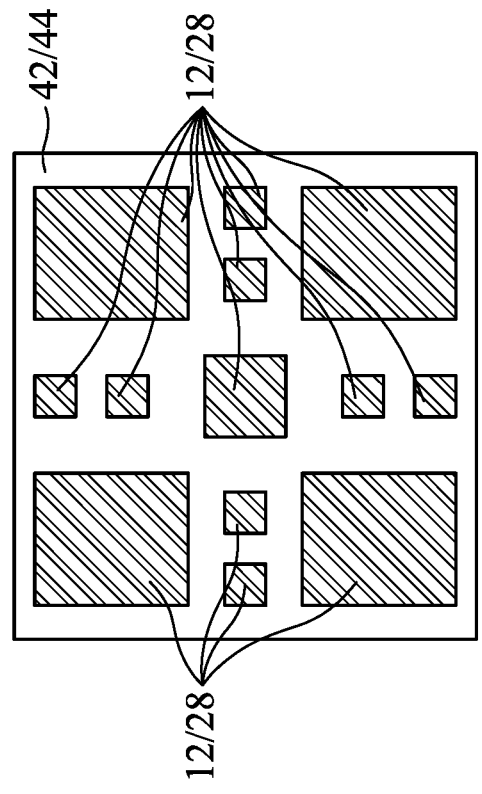
FIG. 23

PACKAGES INCLUDING MULTIPLE ENCAPSULATED SUBSTRATE BLOCKS AND OVERLAPPING REDISTRIBUTION STRUCTURES

PRIORITY CLAIM AND CROSS-REFERENCE

This application is a divisional of U.S. patent application Ser. No. 17/318,703, filed on May 12, 2021, issued as U.S. Pat. No. 11,842,935, and entitled "Packages with Multiple Encapsulated Substrate Blocks," which claims the benefit of the following provisionally filed U.S. patent application: Application No. 63/150,725, filed on Feb. 18, 2021, and entitled "Multi-cell Package," which applications are hereby incorporated herein by reference.

BACKGROUND

Package substrates were used in the packaging of integrated circuits. A typical packaging process may include bonding device dies to a package substrate, molding the device dies in a molding compound, and forming a fan-out redistribution structure over the device dies and the molding compound.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 18 illustrate the cross-sectional views of intermediate stages in the formation of an integrated fan-out package and its bonding to other package components in accordance with some embodiments.

FIGS. 19 and 20 illustrate the top views of some substrate blocks and the overlying fan-out redistribution lines in accordance with some embodiments.

FIGS. 21-23 illustrate the top views of the encapsulated substrate blocks and package components in accordance with some embodiments.

DETAILED DESCRIPTION

Figure 1:
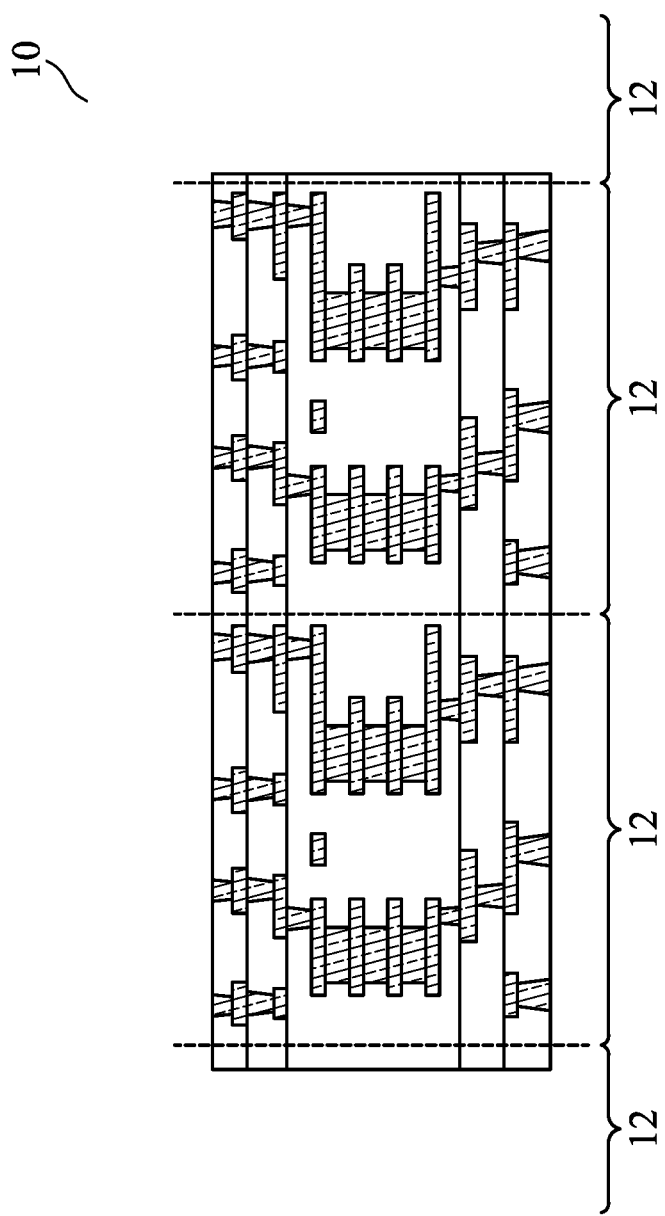
FIG. 1 illustrates the singulation of a package component into a plurality of discrete substrate blocks in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided. In accordance with some embodiments of the present disclosure, a reconstructed substrate is formed. To form the reconstructed substrate, a package substrate strip is singulated into a plurality of discrete substrate blocks, which are encapsulated in an encapsulant. A fan-out redistribution structure is formed over the encapsulated substrate blocks to form the reconstructed package substrate. Device dies are bonded over the reconstructed package substrate. The Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 37:
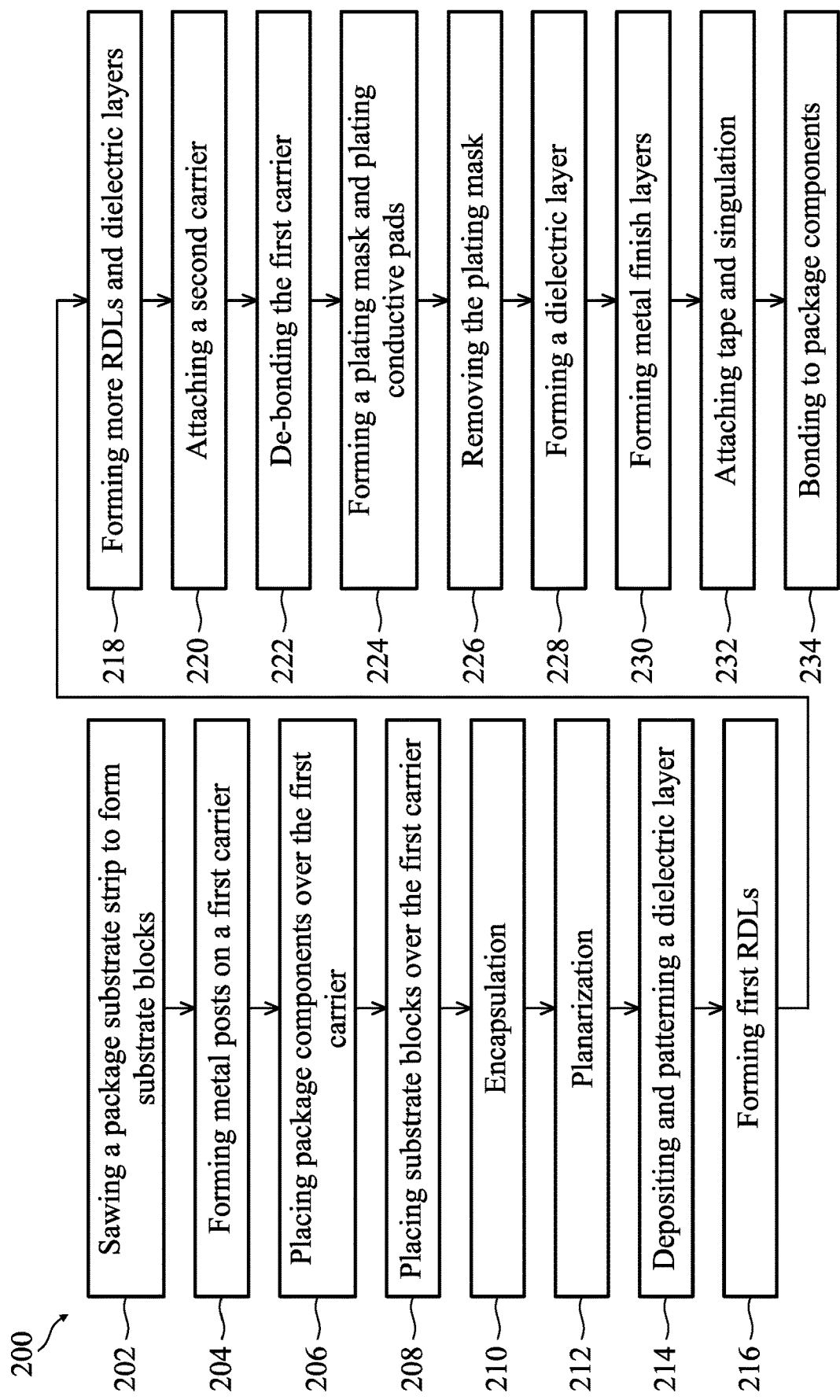
FIG. 37 illustrates a process flow for forming a package in accordance with some embodiments.

FIGS. 1 through 18 illustrate the cross-sectional views of intermediate stages in the formation of reconstructed package substrates and the bonding of the reconstructed package substrates to other package components in accordance with some embodiments of the present disclosure. The corresponding processes are also reflected schematically in the process flow 200 as shown in FIG. 37.

Figure 24:
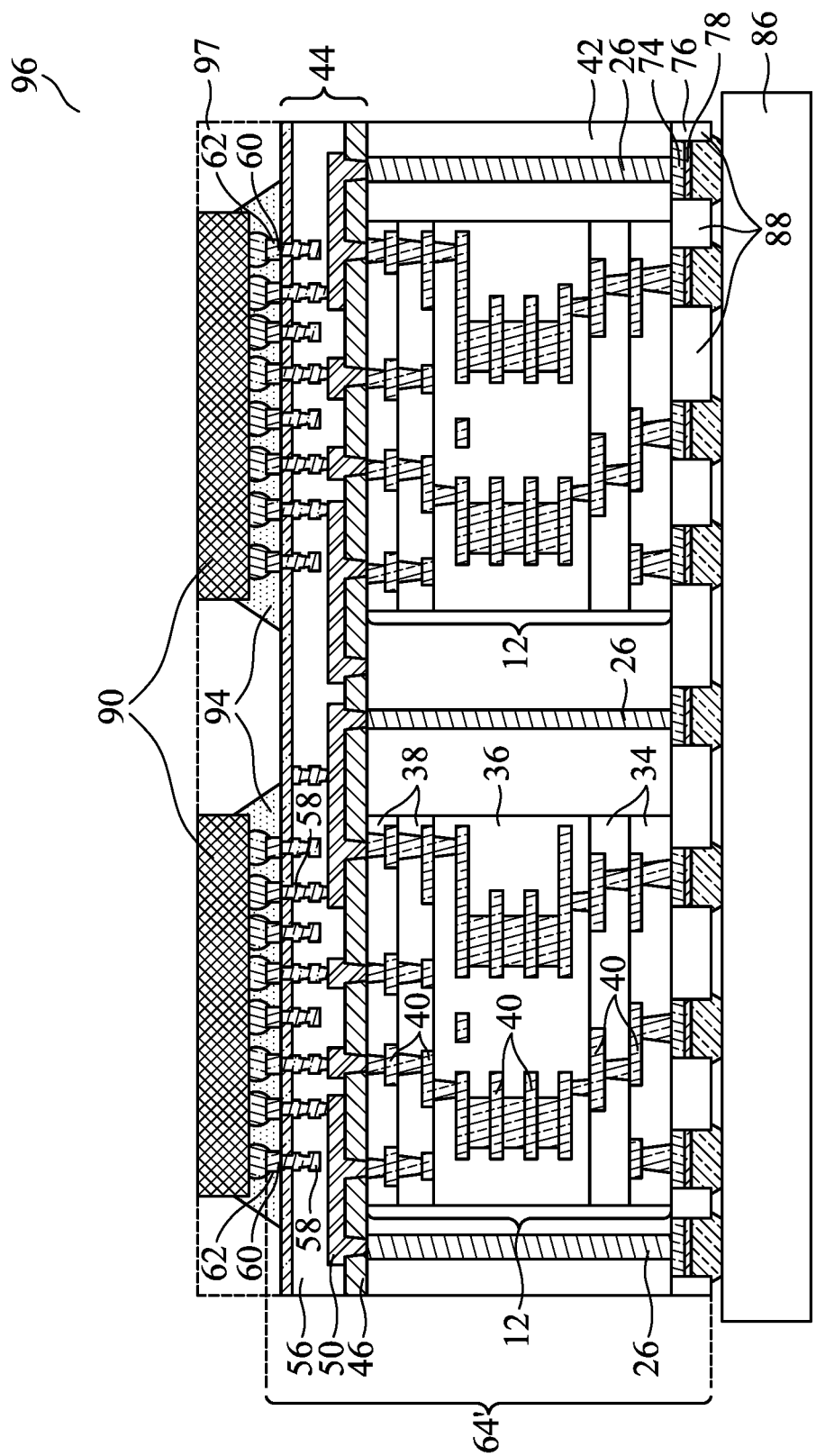
FIGS. 24-26 illustrate the cross-sectional views of the packages with different types of substrate blocks in accordance with some embodiments.
Figure 25:
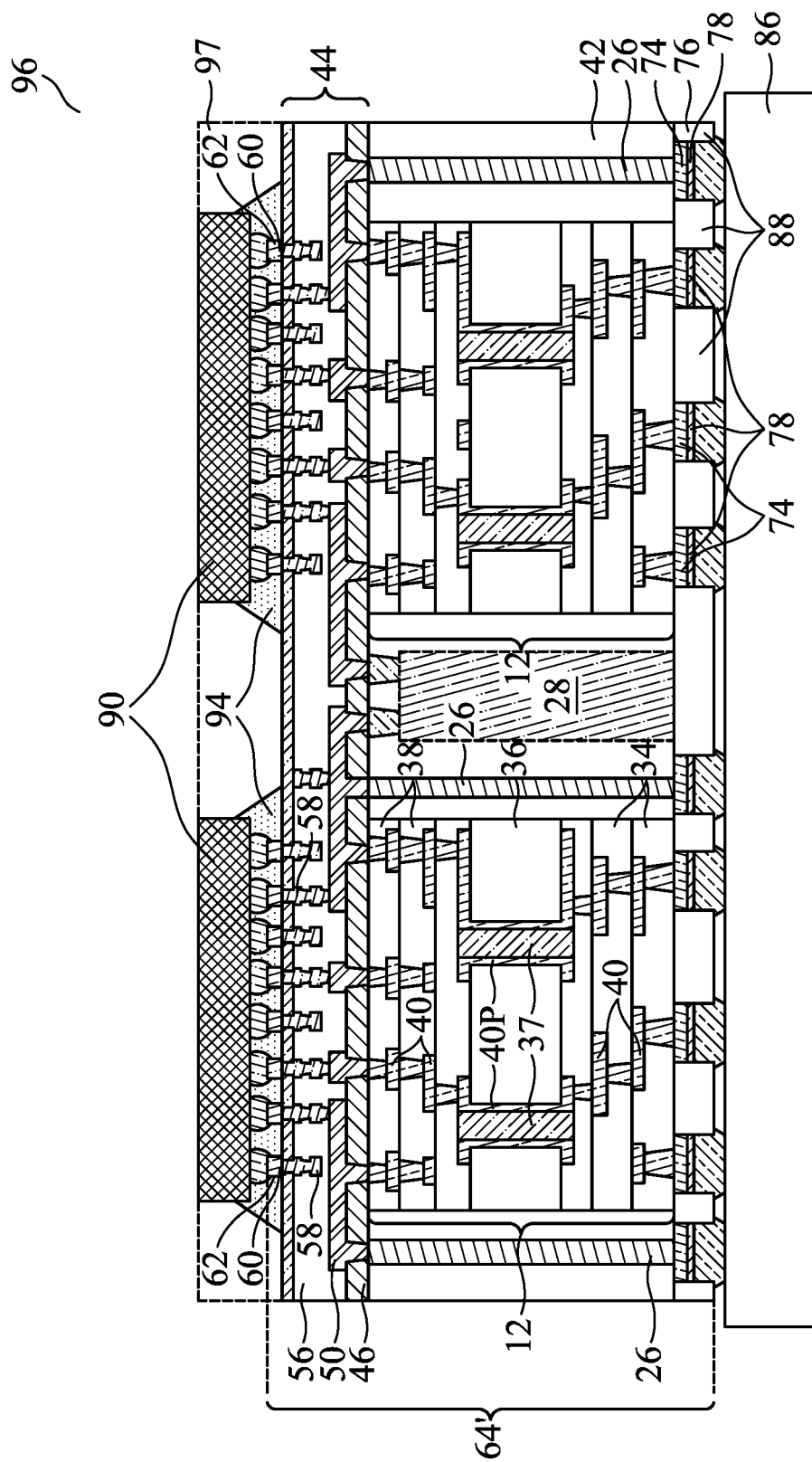
Figure 26:
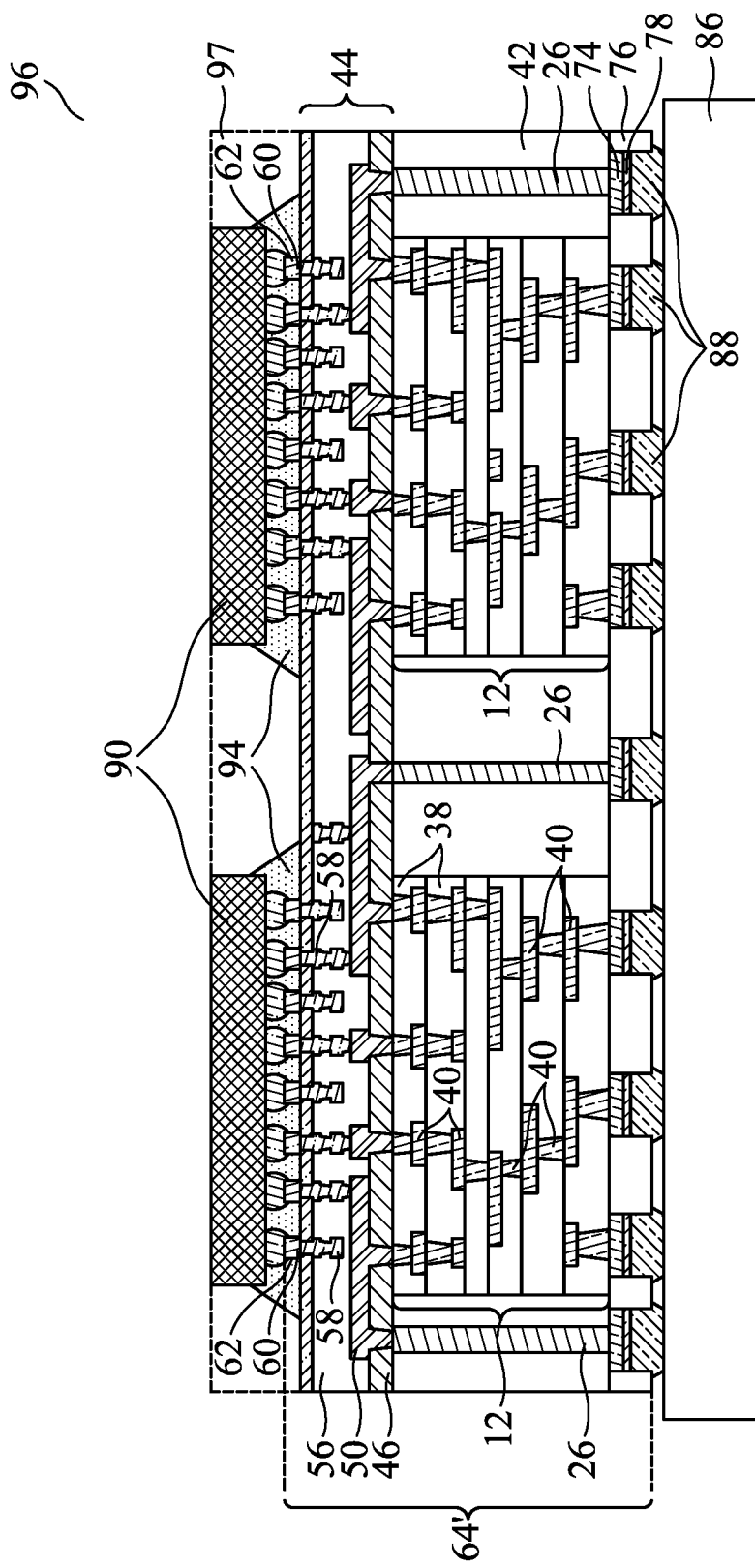

FIG. 1 illustrates a cross-sectional view of a package component 10, which includes a plurality of identical package components 12 therein. In accordance with some embodiments, package component 10 is a package substrate strip, which includes a plurality of package components 12 therein. Package components 12 may be cored package substrates including cores (as shown in FIG. 25), or may be core-less package substrates (as shown in FIGS. 1, 24, and 26) that do not have cores therein. The detailed structures of the example package components 12 are discussed in subsequent paragraphs. In accordance with alternative embodiments, package component 10 may include other types of package components such as interposers, printed circuit boards, or the like. Package component 10 is free from active devices such as transistors and diodes therein. Package component 10 may also be free from (or may include) passive devices such as capacitors, inductors, resistors, or the like therein.

Package component 10 is singulated, for example, through a sawing process, so that the plurality of package components 12 are separated from each other as discrete package components. The respective process is illustrated as process 202 in the process flow 200 as shown in FIG. 37. The plurality of package components 12 may be identical to each other. In accordance with some embodiments, package components 12 are package substrates, and hence are referred to as substrate blocks 12 hereinafter, while the term "substrate block" also encompasses other types of package components other than package substrates.

Referring to FIG. 2, carrier 20 is provided, and release film 22 is coated on carrier 20. Carrier 20 is formed of a transparent material, and may be a glass carrier, a ceramic carrier, or the like. Release film 22 may be formed of a Light-To-Heat-Conversion (LTHC) coating material. In accordance with some embodiments of the present disclosure, the LTHC coating material is capable of being decomposed under the heat of light/radiation (such as a laser beam), and hence can release carrier 20 from the structure formed thereon. Buffer layer 24 may be formed on release film 22. In accordance with some embodiments, buffer layer 24 is formed of or comprises a polymer such as polyimide, polybenzoxazole (PBO), benzocyclobutene (BCB), or the like. In accordance with alternative embodiments, buffer layer 24 is not formed.

Figure 7:
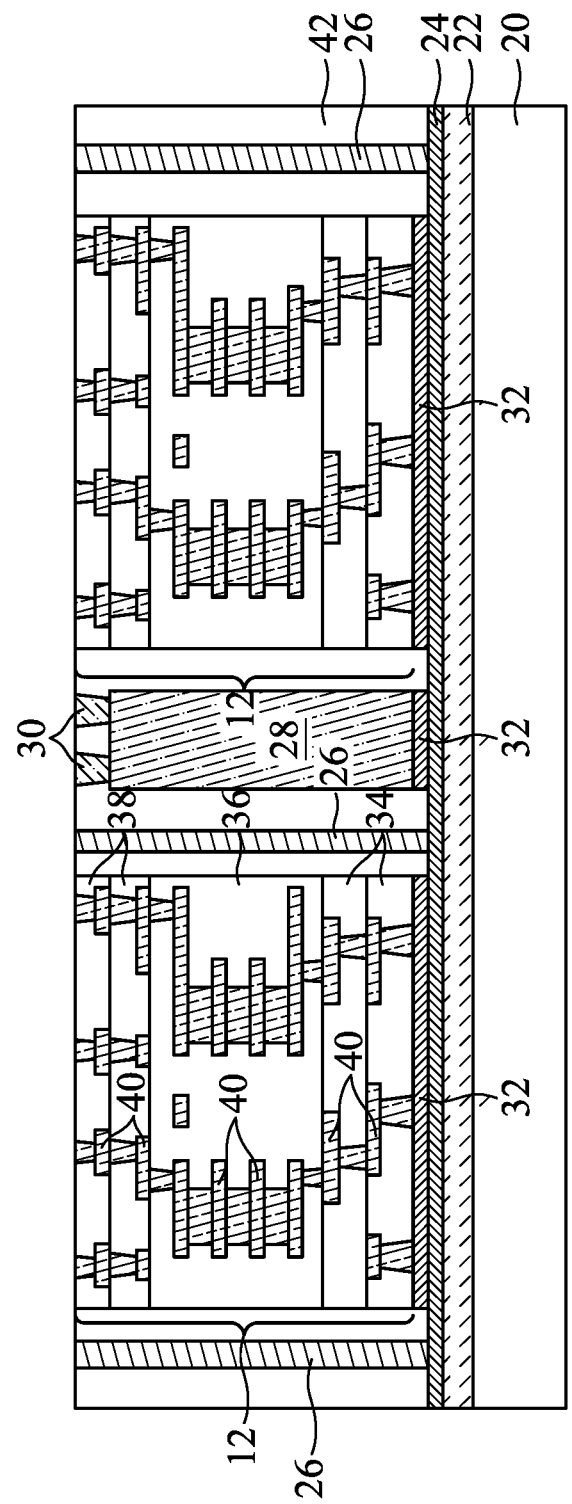

FIG. 3 illustrates the formation of metal posts 26. The respective process is illustrated as process 204 in the process flow 200 as shown in FIG. 37. Throughout the description, metal posts 26 are alternatively referred to as through-vias 26 since metal posts 26 will penetrate through the subsequently formed encapsulant 42 (FIG. 7). In accordance with some embodiments, the formation of metal posts 26 may include depositing a metal seed layer, for example, through Physical Vapor Deposition (PVD), dispensing and patterning a plating mask (which may be formed of photo resist), plating a conductive material into the opening in the plating mask, removing the plating mask, and etching the exposed portions of the metal seed layer. In accordance with some embodiments of the present disclosure, the metal seed layer includes a titanium layer and a copper layer over the titanium layer. The plated material may include copper or a copper alloy.

Figure 4:
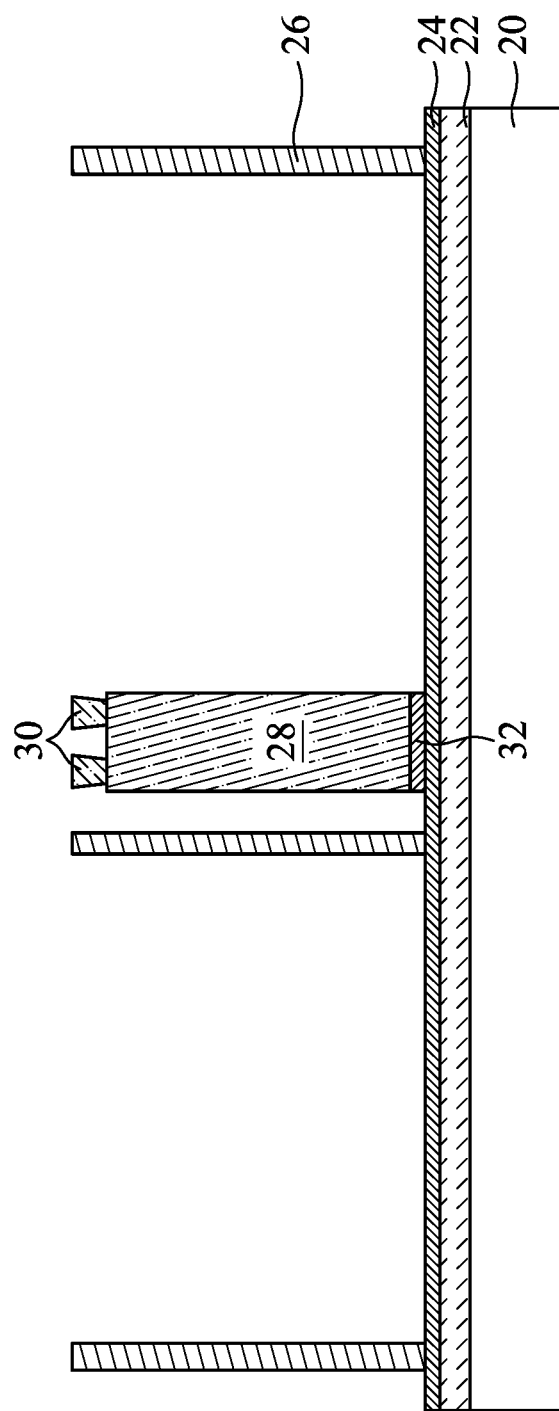

FIG. 4 illustrates the placement/attachment of package component(s) 28 in accordance with some embodiments. The respective process is illustrated as process 206 in the process flow 200 as shown in FIG. 37. Package component 28 may be a device die, a bridge chip (interconnect chip), an Independent Passive Device (such as a capacitor, an inductor, or a resistor), a package, a die stack, or the like. The die stack may be a memory die stack, which may include memory dies such as Dynamic Random Access Memory (DRAM) dies, Static Random Access Memory (SRAM) dies, Magneto-resistive Random Access Memory (MRAM) dies, Resistive Random Access Memory (RRAM) dies, or other types of memory dies. The memory stack may also be a High Bandwidth Memory (HBM) die stack. Package component 28 is attached to polymer buffer layer 24 through Die-Attach Film (DAF) 32, which is an adhesive film pre-attached on package component 28 before package component 28 is placed on buffer layer 24. Package component 28 may include a semiconductor substrate having a back surface (the surface facing down) in physical contact with DAF 32. Since carrier 20 is at wafer level, although one package component 28 is illustrated, it represents a plurality of identical package components 28 placed over release film 22. Package components 28 may be allocated as having a repeating pattern such as an array, which includes a plurality of rows and a plurality of columns.

In accordance with some embodiments, conductive features 30 (such as copper pillars) are pre-formed as the surface features of package component 28, and conductive features 30 are electrically coupled to the integrated circuit devices such as transistors (when package component 28 comprises a device die), passive device(s) (when package component 28 comprises an IPD), or the like. In accordance with some embodiments of the present disclosure, a dielectric layer (not shown) such as a polymer layer fills the gaps between neighboring conductive features 30 to form a top dielectric layer. The polymer layer may be formed of PBO or polyimide in accordance with some embodiments of the present disclosure.

In accordance with alternative embodiments, no package component is attached to buffer layer 24. Accordingly, in the subsequently formed encapsulant 42 (FIG. 7), there may not be any device/chip that include active/passive devices encapsulated in encapsulant 42.

Figure 5:
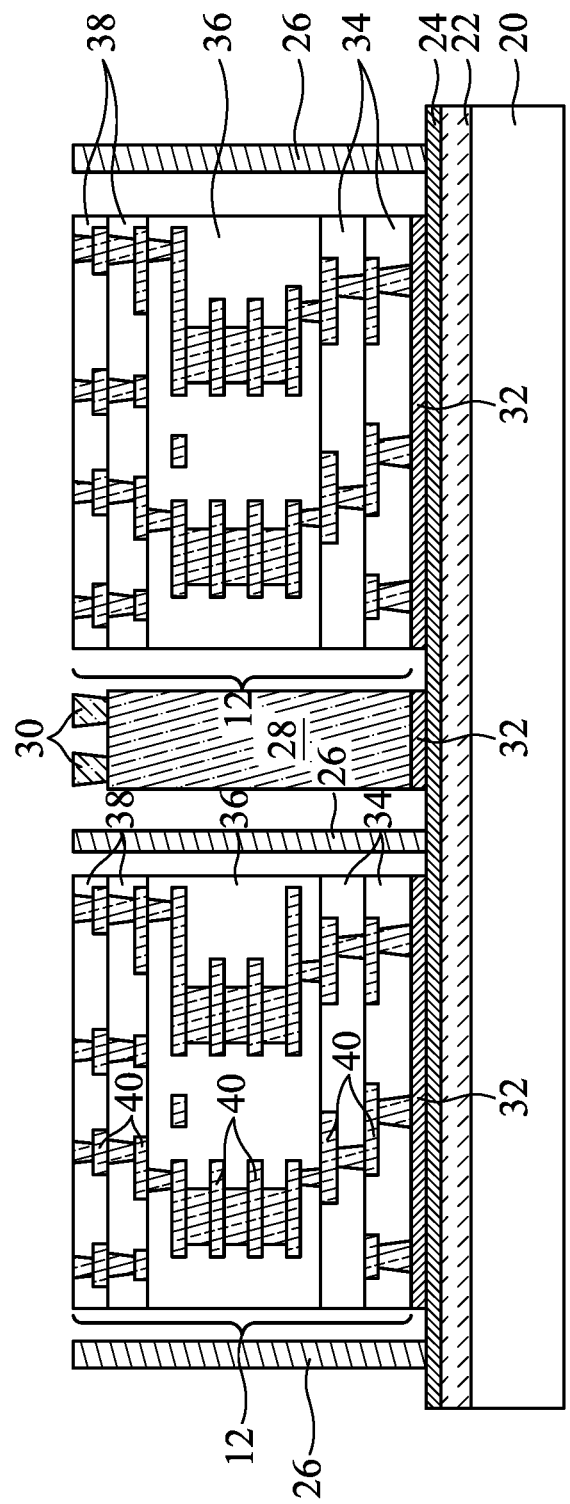

Referring to FIG. 5, substrate blocks 12 are placed over and attached to buffer layer 24. The respective process is illustrated as process 208 in the process flow 200 as shown in FIG. 37. Each of substrate blocks 12 may be attached to buffer layer 24 through one of DAFs 32. In accordance with some embodiments, substrate blocks 12 include dielectric layers 34, core dielectric layers 36 over dielectric layers 34, and dielectric layers 38 over core dielectric layers 36. The total count of dielectric layers 34 may be equal to or greater than 1. The total count of dielectric layers 36 may be equal to or greater than 2. The total count of dielectric layers 38 may be equal to or greater than 1. Dielectric layers 34 and 38 may be formed of dry films such as Ajinomoto Build-up Films (ABFs), PBO, polyimide, or the like, which may be coated in a flowable form and then cured. Core dielectric layers 36 may be formed of epoxy, resin, glass fiber, prepreg (which comprises epoxy, resin, and/or glass fiber), glass, molding compound, plastic, combinations thereof, and/or multi-layers thereof. The thickness of each of dielectric layers 34 and 38 may be in the range between about 7 µm and about 9 µm. Redistribution lines 40, which include metal lines/pads and vias, are formed in dielectric layers 34, 36, and 38. Redistribution lines 40 are interconnected to form through-connections in substrate blocks 12. In accordance with some embodiments, as shown in FIG. 5, the redistribution lines 40 in dielectric layers 36 are mainly for routing power and ground, and hence may be in the form of power planes (large metal plates), rather than thin metal traces. Substrate blocks 12 may be identical to each other, or may have structures different from each other. For example, the number of layers, the sizes, and/or the material in different substrate blocks 12 may be identical to each other or different from each other.

Figure 6:
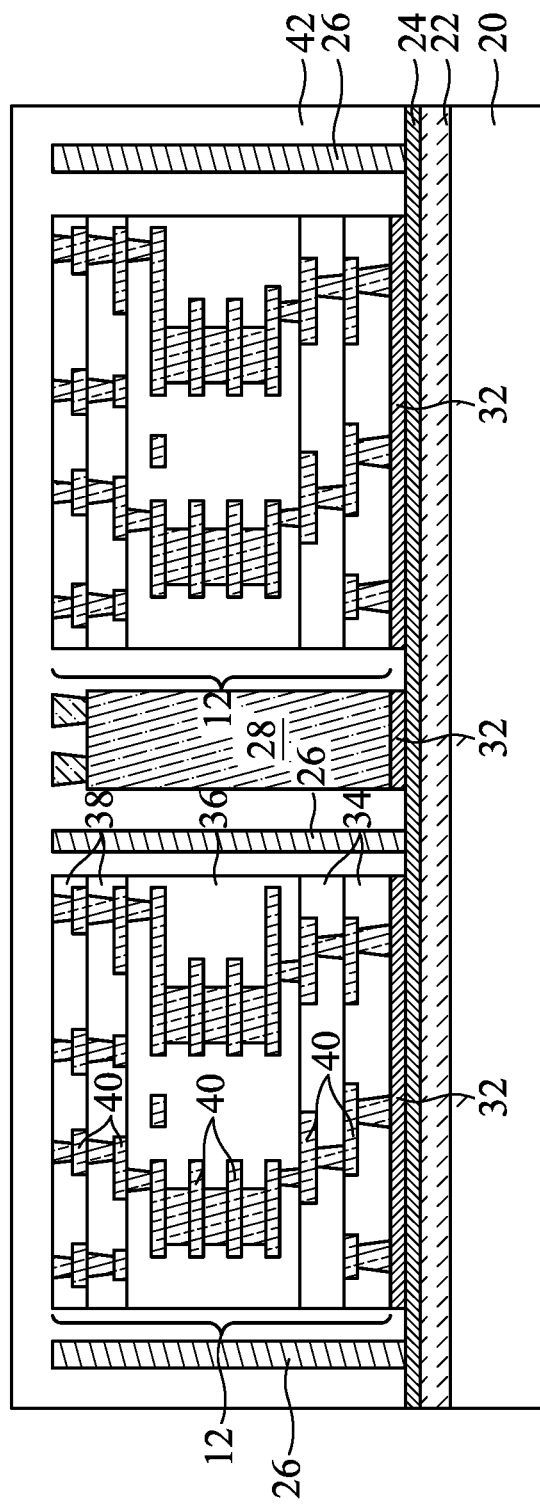

Next, substrate blocks 12, metal posts 26, and package component 28 are encapsulated in encapsulant 42, as shown in FIG. 6. The respective process is illustrated as process 210 in the process flow 200 as shown in FIG. 37. Encapsulant 42 may include a molding compound, a molding underfill, an epoxy, and/or a resin. The molding compound may include a base material (42A, FIGS. 35 and 36), which may be a polymer, a resin, an epoxy, or the like, and filler particles 42B in base material 42A. The filler particles may be dielectric particles of $SiO_2$, $Al_2O_3$, silica, or the like, and may have spherical shapes. Also, the spherical filler particles may have the same or different diameters.

In a subsequent step, as shown in FIG. 7, a planarization process such as a Chemical Mechanical Polish (CMP) process or a mechanical grinding process is performed to polish encapsulant 42, until substrate blocks 12, metal posts 26, and the conductive features 30 of package component 28 are all exposed. The respective process is illustrated as process 212 in the process flow 200 as shown in FIG. 37. As a result of the planarization process, metal posts 26 penetrate through encapsulant 42, and hence are alternatively referred to as through-vias 26 hereinafter. Due to the planarization process, the top ends of through-vias 26 and the top redistribution lines 40 are substantially level (coplanar) with the top surfaces of conductive features 30, and are substantially coplanar with the top surface of encapsulant 42.

Figure 8:
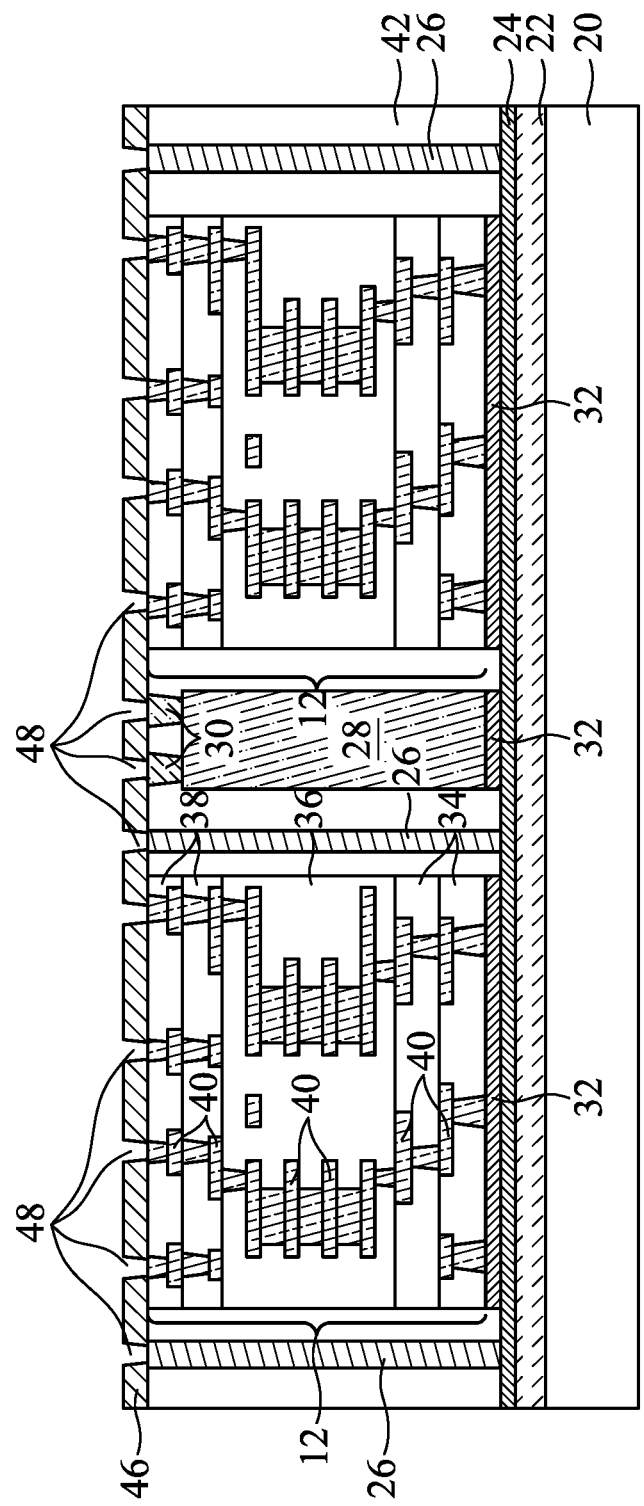
Figure 9:
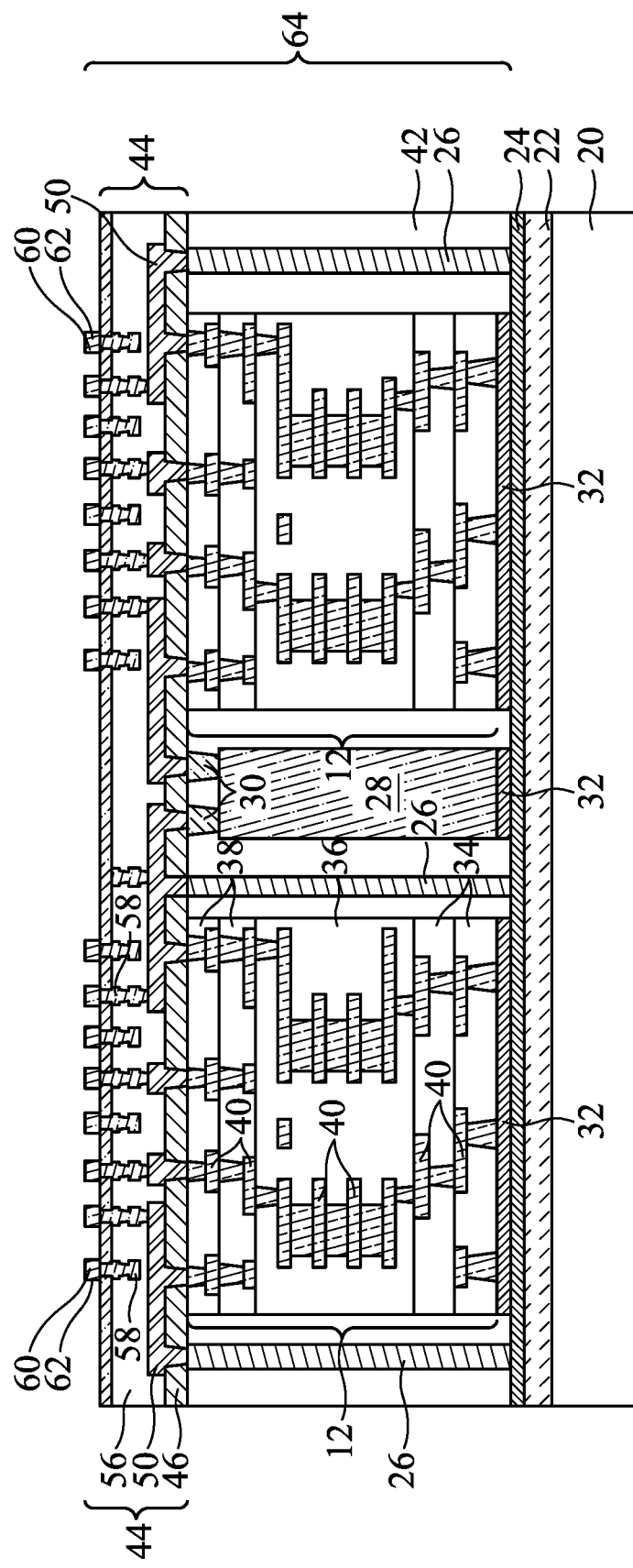

FIGS. 8 and 9 illustrate the formation of front-side redistribution structure 44. Referring to FIG. 8, dielectric layer 46 is formed over substrate blocks 12, metal posts 26, package component 28, and encapsulant 42. Dielectric layer 46 is then patterned. The respective process is illustrated as process 214 in the process flow 200 as shown in FIG. 37. Openings 48 are formed in the patterning process to reveal metal posts 26, RDLs 40, and conductive features 30. In accordance with some embodiments of the present disclosure, dielectric layer 46 is formed of or comprises a polymer such as PBO, polyimide, benzocyclobutene (BCB), or the like. The formation process may include coating dielectric layer 46 in a flowable form, and then curing dielectric layer 46. In accordance with some embodiments in which dielectric layer 46 is formed of a photo sensitive material such as PBO or polyimide, the formation of openings 48 may involve a photo exposure process using a lithography mask (not shown) to light-expose dielectric layer 46, and then developing dielectric layer 46. In accordance with alternative embodiments of the present disclosure, dielectric layer 46 is formed of an inorganic dielectric material such as silicon nitride, silicon oxide, or the like. The formation process may include Chemical Vapor Deposition (CVD), Atomic Layer Deposition (ALD), Plasma-Enhanced Chemical Vapor Deposition (PECVD), or other applicable deposition processes. Through-vias 26 and conductive features 30 are exposed through openings 48.

RDLs 50 are formed and extending into openings 48. The respective process is illustrated as process 216 in the process flow 200 as shown in FIG. 37. In accordance with some embodiments, the formation of RDLs 50 may include depositing a metal seed layer, for example, through Physical Vapor Deposition (PVD). The metal seed layer extends into openings 48 and also covers dielectric layer 46. A plating mask (not shown), which may be formed of photo resist, is then formed. A conductive material is plated into the openings in the plating mask, followed by the removal of the plating mask, hence exposing some portions of the metal seed layer. The exposed portions of the metal seed layer are then etched, hence forming RDLs 50.

Next, as also shown in FIG. 9, more dielectric layers 56 and RDLs 58 are formed over dielectric layer 46 and RDLs 50. The respective process is illustrated as process 218 in the process flow 200 as shown in FIG. 37. The formation processes and materials may be similar to the processes and materials of dielectric layer 46 and RDLs 50, respectively. It is appreciated that although two layers of RDLs 58 are illustrated, there may be more layers of RDLs 58 formed, depending on the routing requirement. RDLs 50 and 58 may be fine-line RDLs, which have line widths and line pitches smaller than the line widths and line pitches, respectively, of the underlying RDLs 40 in substrate blocks 12.

FIG. 9 further illustrates the formation of electrical connectors 60, which may be formed through plating, with the processes and the materials similar to the corresponding processes and the materials of RDLs 50. Surface finish layers 62 may also be formed, which may include nickel, Electroless Nickel Immersion Gold (ENIG), Electroless Nickel Electroless Palladium Immersion Gold (ENEPIG), and/or the like. In accordance with alternative embodiments, the formation of Electrical connectors 60 may include forming Under-Bump Metallurgies (UBMs), placing solder balls on the UBMs, and then reflowing the solder balls. The resulting electrical connectors 60 thus may include solder regions. In accordance with alternative embodiments of the present disclosure, the formation of electrical connectors 60 includes performing a plating process to form solder layers over the UBMs, and then reflowing the solder layers. Throughout the description, the structure over buffer layer 24 is referred to as reconstructed wafer 64.

Figure 10:
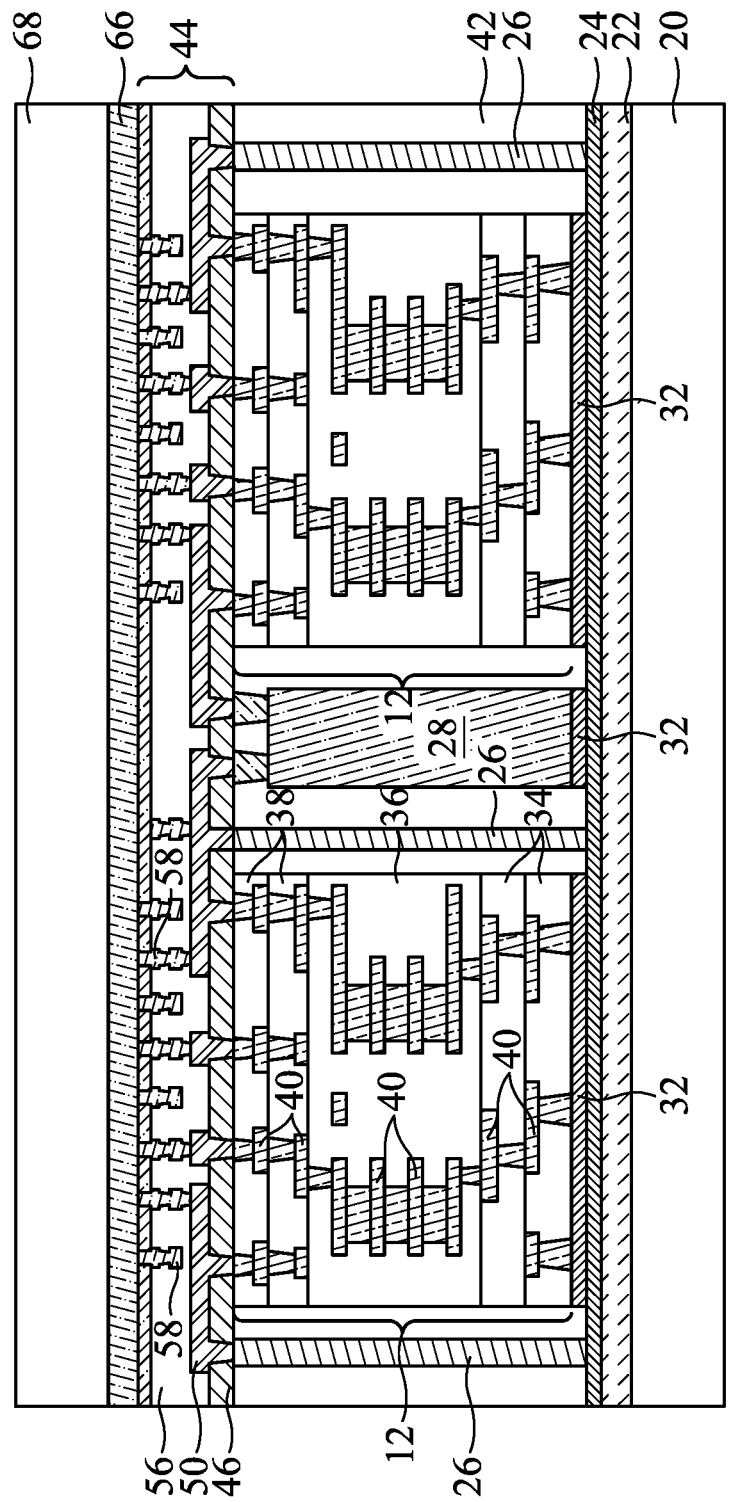
Figure 11:
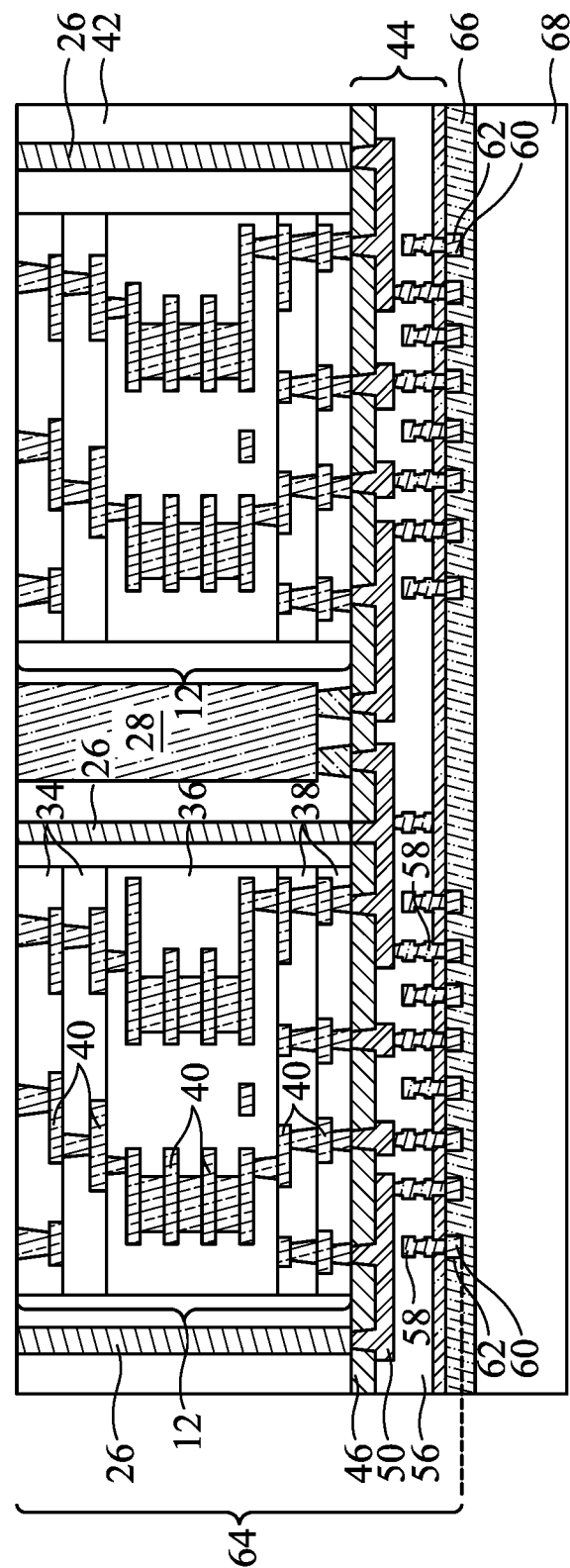

FIGS. 10 and 11 illustrate a carrier switch process. Referring to FIG. 10, carrier 68 is adhered to reconstructed wafer 64, for example, through adhesive film 66. The respective process is illustrated as process 220 in the process flow 200 as shown in FIG. 37. Next, the structure shown in FIG. 10 is flipped upside down. Reconstructed wafer 64 is then de-bonded from carrier 20. The respective process is illustrated as process 222 in the process flow 200 as shown in FIG. 37. In accordance with some embodiments, a light beam such as a laser beam is projected on release film 22, and release film 22 is de-composed under the heat of the light beam. In a subsequent process, a backside grinding process is performed on reconstructed wafer 64, so that buffer layer 24 is removed. Through-vias 26 and the redistribution lines 40 in package component 28 are exposed. DAFs 32 are also removed during the backside grinding process. The resulting reconstructed wafer 64 is shown in FIG. 11.

Figure 12:
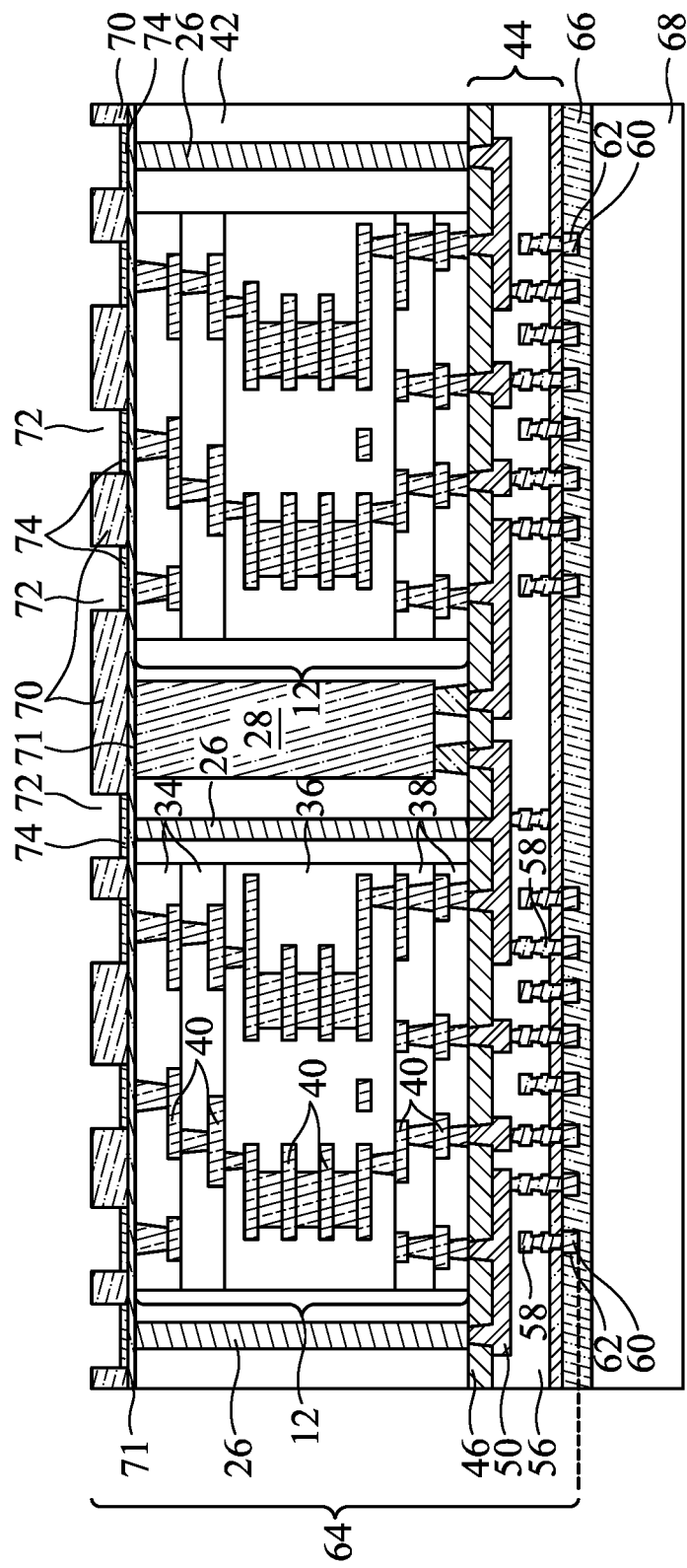

Referring to FIG. 12, metal seed layer 71 is deposited. In accordance with some embodiments, metal seed layer 71 includes a titanium layer and a copper layer over the titanium layer. The formation process may include PVD or other application processes. Patterned plating mask 70 is then formed. The respective process is illustrated as process 224 in the process flow 200 as shown in FIG. 37. Openings 72 are formed in plating mask 70, exposing the underlying portions of metal seed layer 71, which portions are directly over redistribution lines 40 and through-vias 26. In accordance with some embodiments, plating mask 70 comprises a dry film, which is laminated and then patterned in a photo lithography process. In accordance with alternative embodiments, plating mask 70 comprises a photo resist, which may be formed through a light-exposure process and a development process. Conductive pads 74 are formed in openings 72 through a plating process. The respective process is also illustrated as process 224 in the process flow 200 as shown in FIG. 37. In accordance with some embodiments, conductive pads 74 comprise copper or a copper alloy.

Figure 13:
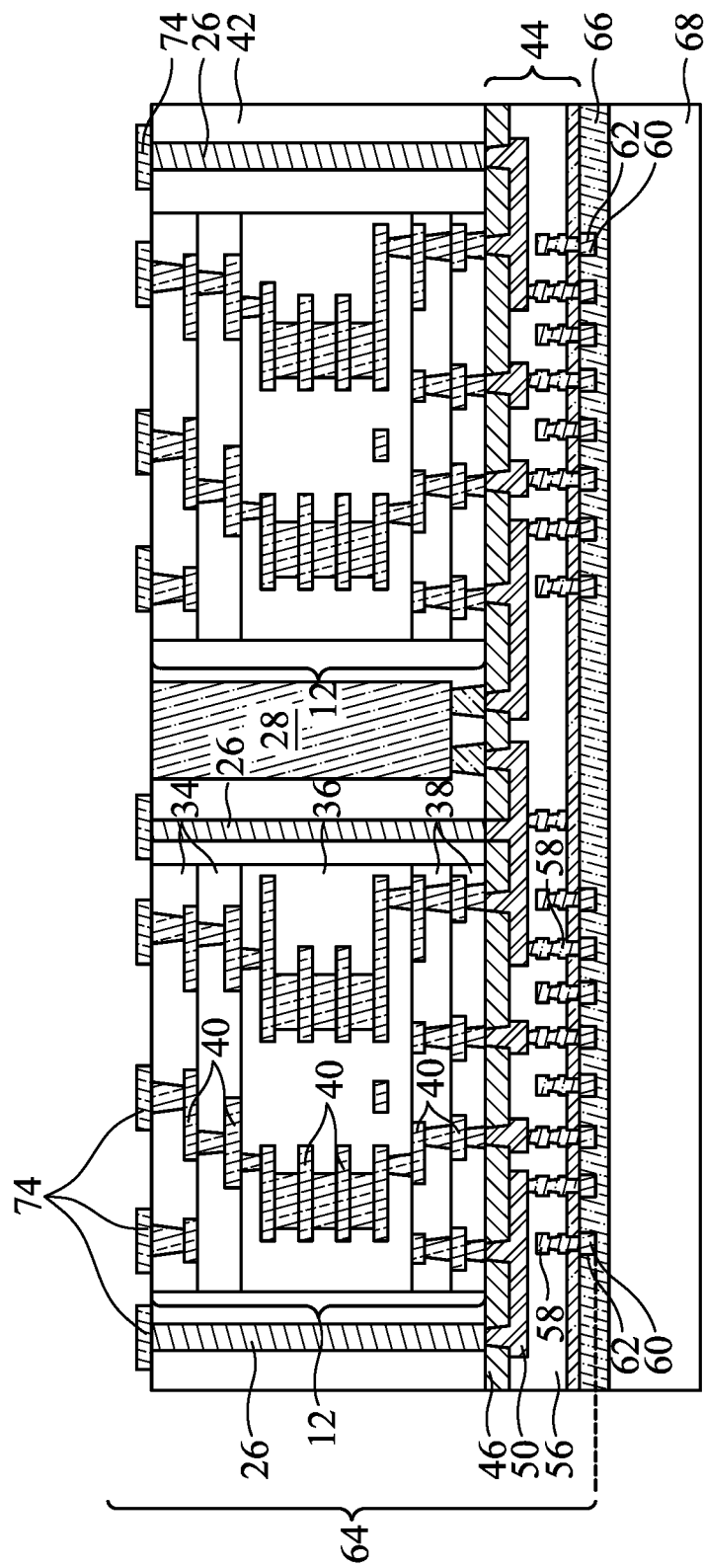

In a subsequent process, the patterned plating mask 70 is removed, exposing the underlying metal seed layer 71. The respective process is illustrated as process 226 in the process flow 200 as shown in FIG. 37. Next, the exposed portions of metal seed layer 71 are etched using the conductive pads 74 as an etching mask. The remaining portions of the metal seed layer 71 directly underlying the plated conductive pads 74 are also considered as parts of conductive pads 74. The resulting structure is shown in FIG. 13.

Figure 14:
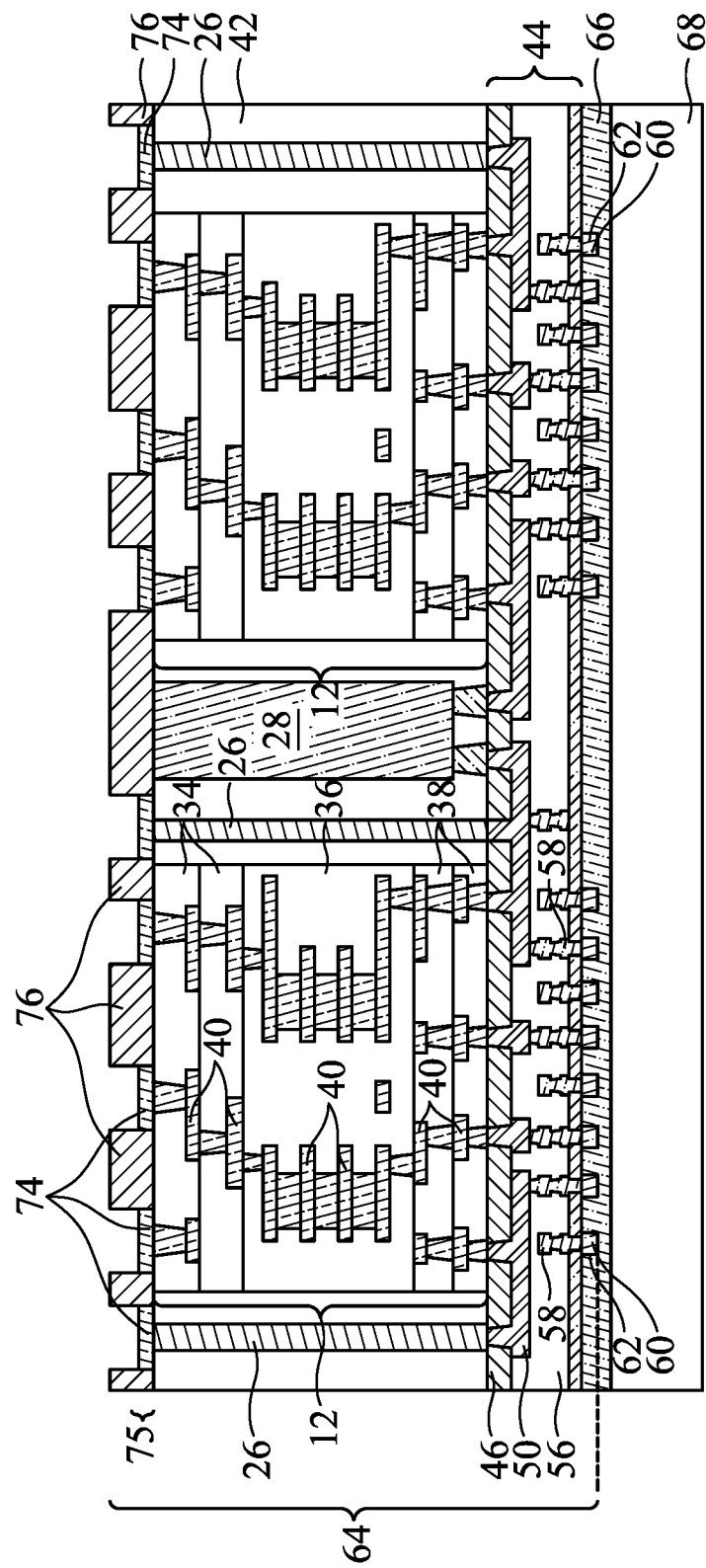

FIG. 14 illustrates the formation of dielectric layer 76, which may act as a solder mask. The respective process is illustrated as process 228 in the process flow 200 as shown in FIG. 37. In accordance with some embodiments, the formation of dielectric layer 76 comprises coating or depositing a blanket dielectric layer, with conductive pads 74 being covered, and then patterning the blanket dielectric layer. Alternatively, the formation of dielectric layer 76 comprises a printing process or a lifting process. In accordance with some embodiments, dielectric layer 76 covers the edge portions of conductive pads 74, while exposing a central portion of each of conductive pads 74. In accordance with alternative embodiments, as shown in FIG. 14, dielectric layer 76 has its edges contacting the edges of conductive pads 74, and do not extend directly over conductive pads 74.

In accordance with some embodiments, as shown in FIG. 14, there is a single layer of conductive pads/lines 74 formed on the backside of package component 28. The conductive pads/lines and the corresponding dielectric layers (if any) are collectively referred to as a backside redistribution structure 75. In accordance with alternative embodiments, backside redistribution structure 75 includes a plurality of layers of RDLs and dielectric layers, which have a similar structure, and may be formed of similar materials as, RDLs 50 and 58 and dielectric layers 46 and 56, respectively. Accordingly, reconstructed wafer 64 includes redistribution structures 44 and 75 on opposing sides of, and interconnected through, substrate blocks 12.

Figure 15:
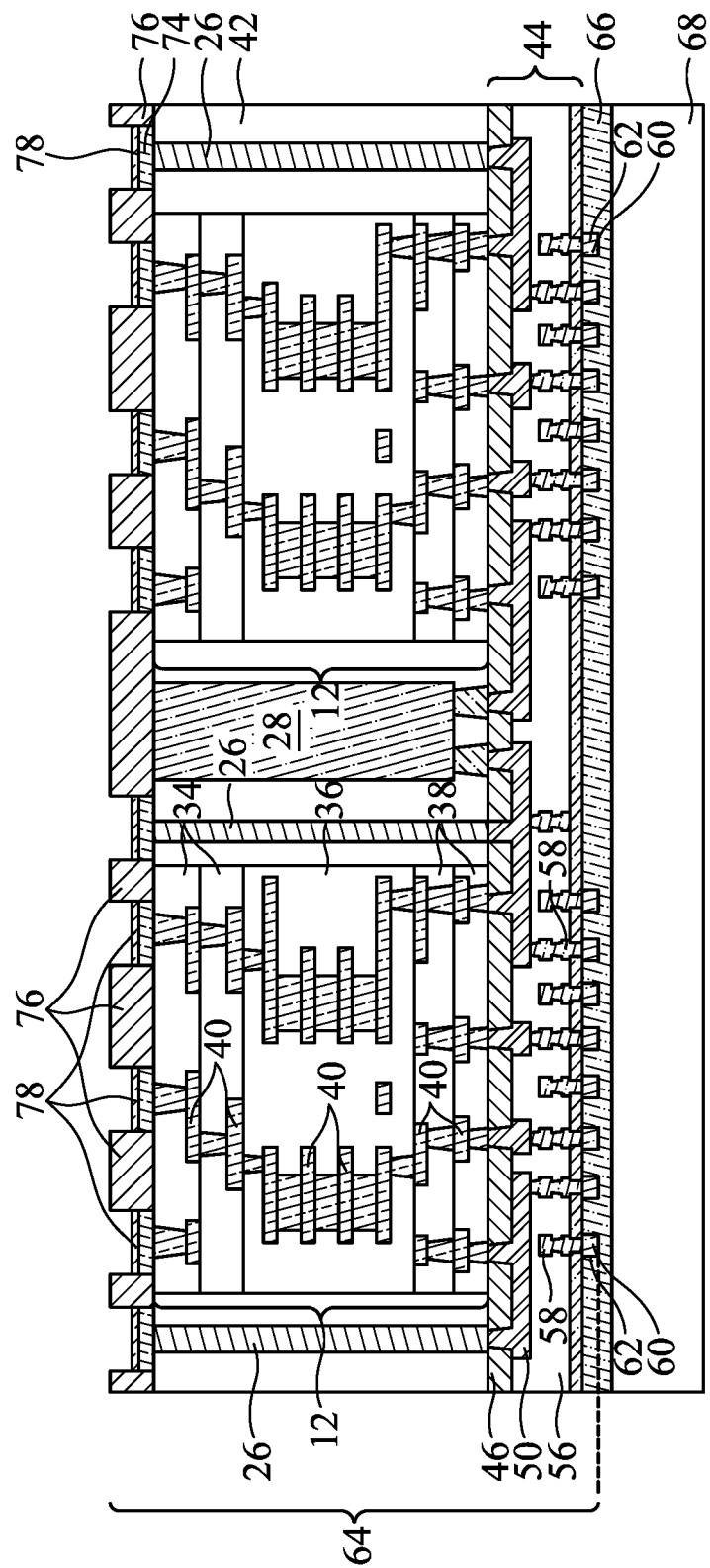

FIG. 15 illustrates the formation of metal finish layers 78, which may include nickel, ENIG, ENEPIG, and/or the like. The respective process is illustrated as process 230 in the process flow 200 as shown in FIG. 37. Metal finish layers 78 may be plated (for example, through electroless plating), and may include a single layer or a plurality of layers formed of different materials. In accordance with alternative embodiments, the process of forming metal finish layers 78 is omitted.

Figure 16:
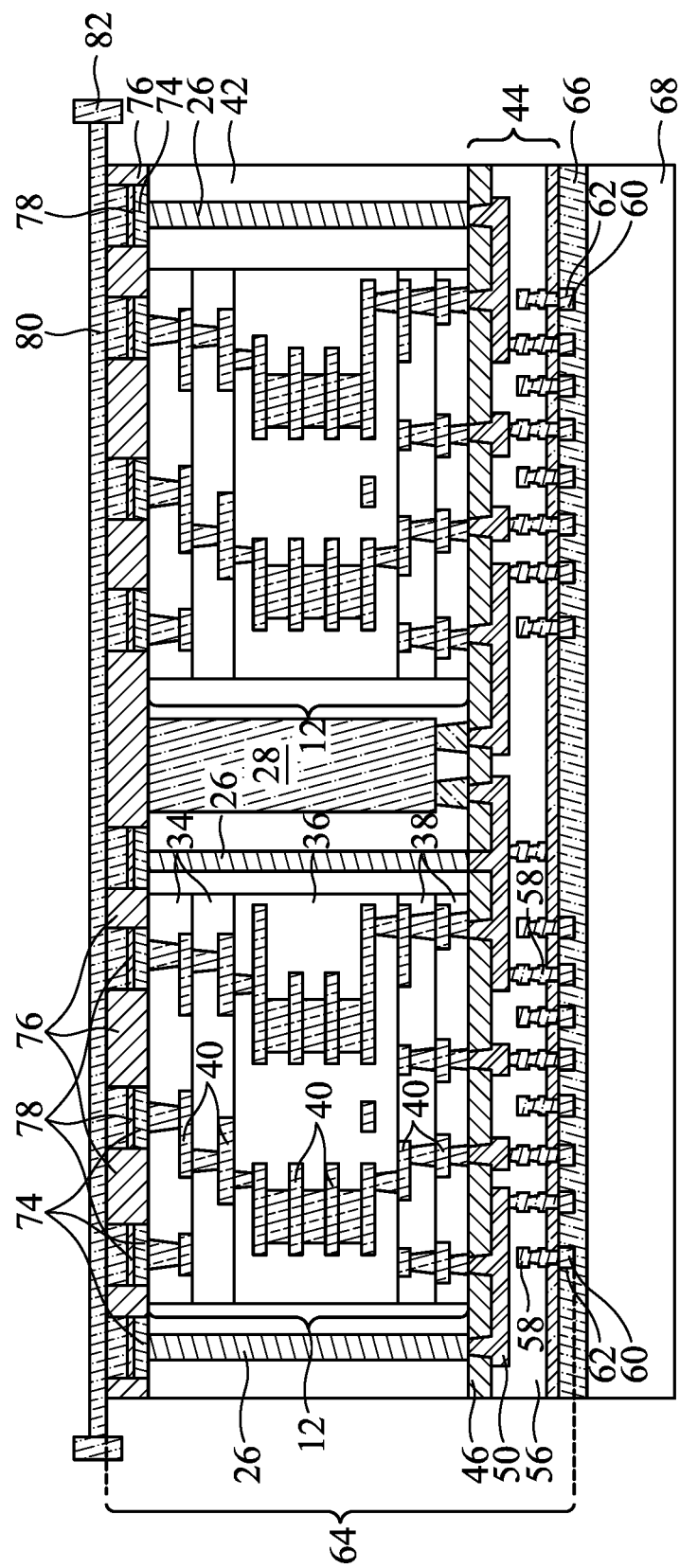
Figure 17:
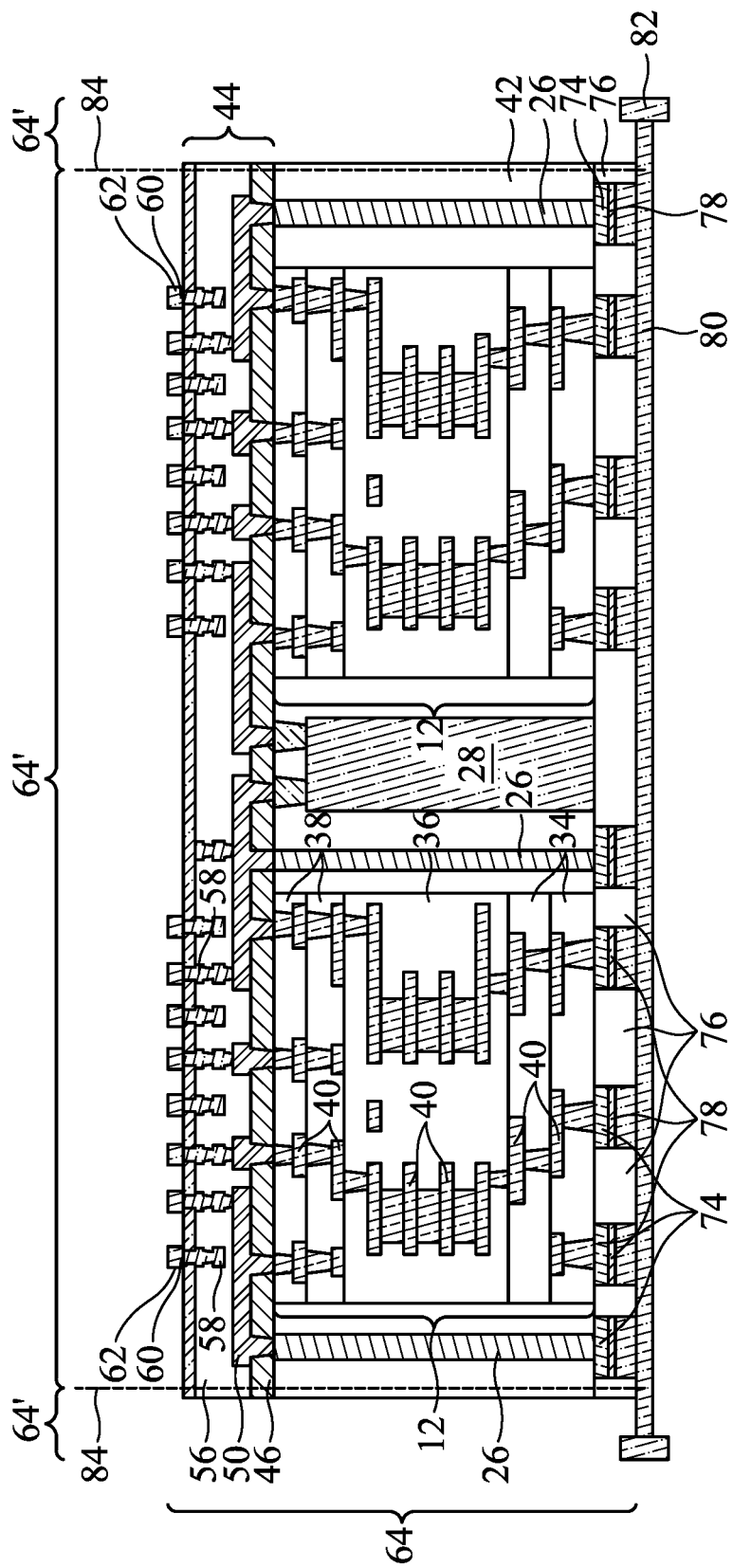

Next, referring to FIG. 16, reconstructed wafer 64 is attached to tape 80, which is further fixed on frame 82. The respective process is illustrated as process 232 in the process flow 200 as shown in FIG. 37. Dielectric layer 76 is in contact with tape 80. Next, as shown in FIG. 17, reconstructed wafer 64 is flipped upside down, and is also de-bonded from carrier 68. Adhesive film 66 (FIG. 16) is also removed. The resulting structure is shown in FIG. 17.

Next, further referring to FIG. 17, a singulation (die-saw) process is performed to separate reconstructed wafer 64 along scribe lines 84, so that reconstructed wafer 64 is separated into discrete reconstructed package substrate 64', which are identical to each other. The respective process is also illustrated as process 232 in the process flow 200 as shown in FIG. 37. The singulation process may be performed on tape 80. The singulation may be performed using a blade, or may be performing using a laser to pre-groove, so that grooves are formed, and then using a blade to cut through the grooves. Reconstructed package substrate 64' is such named since it is formed by sawing package substrate strip 10 (FIG. 1) to form discrete substrate blocks 12, and then re-molding substrate blocks 12 and forming redistribution structure.

Figure 18:
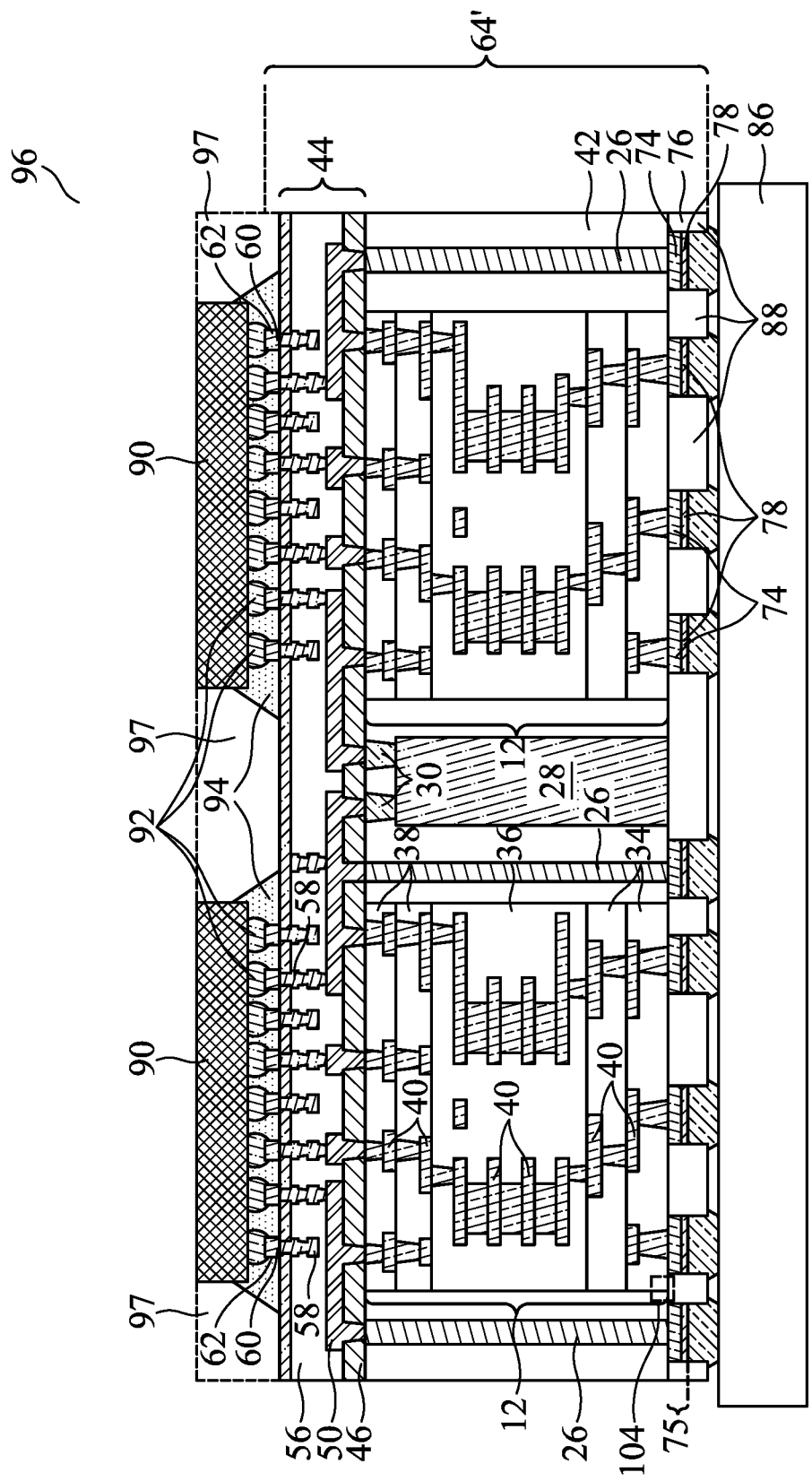

FIG. 18 illustrates the formation of package 96, which includes the bonding of a reconstructed package substrate 64' to package component 86. The respective process is illustrated as process 234 in the process flow 200 as shown in FIG. 37. The bonding may be performed through solder regions 88, while other bonding processes such as metal-to-metal direct bonding, hybrid bonding, or the like, may be used. In accordance with some embodiments of the present disclosure, package component 86 is a printed circuit board, a package, or the like. Package components 90, which may be device dies, packages, IPDs, sockets, or the like, are bonded to electrical connectors 60, for example, through solder regions 92. Underfill 94 is also dispensed into the gaps between package components 90 and the underlying reconstructed package substrate 64'. In accordance with some embodiments, an additional encapsulant 97, which may be a molding compound, a molding underfill, a resin, and epoxy, and/or the like, may be formed to encapsulating package components 90 therein. In accordance with alternative embodiments, encapsulant 97 is not formed. Accordingly, encapsulant 97 is shown as being dashed to indicate that it may or may not be formed.

In the package as shown in 18, a plurality of substrate blocks 12 are encapsulated in, and are separated from each other by, encapsulant 42. A fan-out redistribution structure 44 is formed over the plurality of substrate blocks 12 and the corresponding encapsulant 42. Device dies may be bonded to the reconstructed package substrate. This is different from the conventional structures, in which a plurality of device dies are bonded to a package substrate, and the device dies are encapsulated. Accordingly, an otherwise large package substrate is cut apart and reconstructed. The warpage caused by the large package substrate is thus avoided. Due to the reduction of the warpage, it is also possible to increase the total number of the layers in the package substrate without causing yield loss.

In the package 96 as shown in FIG. 18, substrate blocks 12 include a plurality of dielectric layers 34, 36, and 38. These dielectric layers, instead of extending horizontally from the left edge to the right edge of package 96, are separated into a plurality of discrete substrate blocks 12, and are separated from each other by encapsulant 42. In addition, the top surfaces and the bottom surfaces of the substrate blocks 12 are coplanar with the corresponding top surface and bottom surface of the encapsulant 42 due to planarization processes.

FIGS. 19 and 20 illustrate the top views of some example substrate block 12 and RDLs 50 and 58 in their overlying redistribution structure 44 in accordance with some embodiments. In accordance with some embodiments, RDLs 50 and 58, in addition to connecting substrate blocks 12 to package components 90 (FIG. 18), may also interconnect substrate blocks 12. Substrate blocks 12 are each encircled by encapsulant 42. Although two substrate blocks 12 are illustrated in an example embodiment, there may also be more substrate blocks 12, for example, as shown in FIG. 20, which may be arranged as an array for better expandability. The improved expandability is useful in High-Performance Computing (HPC) modules such as Artificial Intelligence (AI) modules.

FIGS. 21 through 23 illustrate the top views of substrate blocks 12 and package components 28 in accordance with some embodiments. Package components 28 comprise active and/or passive devices, and may be device dies, Integrated Passive Devices (IPDs), packages, or the like. Each of the illustrated rectangles may represent either a substrate block 12 or a package component 28. In accordance with some embodiments, the illustrate rectangles in FIGS. 21 and 22 are all substrate blocks 12. The substrate blocks 12 may be identical to each other or different from each other. For example, as shown in FIGS. 21 and 22, the sizes (and the structures) of substrate blocks 12 are different from each other. In accordance with alternative embodiments, one of the rectangles (such as the large ones) is a substrate block, and the other is a package component 28. In FIG. 23, there are a plurality of substrate blocks 12 and package components 28. In accordance with some example embodiments, there are four substrate blocks 12 (the larger rectangles), with package components 28 (the smaller rectangles) distributed in the spaces between the substrate blocks 12. There may also be different types of package component 28. For example, the rectangle in the middle of FIG. 23 may represent a device die or a die stack, and the smallest rectangles may represent IPDs.

FIGS. 24 through 26 illustrate packages 96 formed in accordance with alternative embodiments of the present disclosure. Unless specified otherwise, the materials and the formation processes of the components in these embodiments are essentially the same as the like components, which are denoted by like reference numerals in the preceding embodiments shown in FIGS. 1 through 23 and the subsequently discussed embodiments as shown in FIGS. 27 through 34. The details regarding the formation processes and the materials of the components shown in FIGS. 24 through 26 may thus be found in the discussion of the preceding embodiments.

FIG. 24 illustrates the package 96 in accordance with some embodiments. These embodiments are similar to the embodiments as shown in FIG. 18, except that there is no package component 28 (that includes passive and/or active devices) encapsulated in encapsulant 42.

FIG. 25 illustrates the package 96 in accordance with some embodiments. These embodiments are similar to the embodiments as shown in FIGS. 18 and 24, except that substrate block 12 includes a core, which includes a core dielectric layer 36, conductive (metal) pipes 40P penetrating through core dielectric layer 36, and dielectric filling material 37 encircled by conductive pipes 40P. In accordance with some embodiments, core dielectric layer 36 is formed of one or more material selected from epoxy, resin, glass fiber, prepreg (which comprises epoxy, resin, and/or glass fiber), glass, molding compound, plastic, combinations thereof, and multi-layers thereof. Package component 28 may be, or may not be, encapsulated in encapsulant 42.

FIG. 26 illustrates the package 96 in accordance with some embodiments. These embodiments are similar to the embodiments as shown in FIG. 18, except that substrate blocks 12 are coreless. In accordance with some embodiments, no package component 28 including passive and/or active devices is encapsulated in encapsulant 42. In accordance with alternative embodiments, the package component 28 (FIG. 18) including at least one of passive and/or active devices is encapsulated in encapsulant 42.

Figure 27:
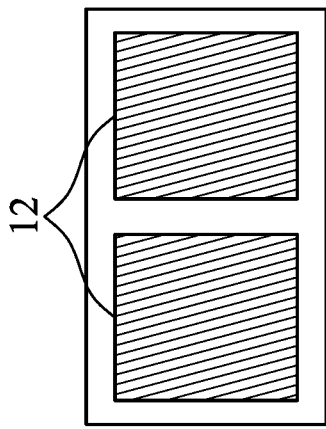
FIGS. 27 and 28 illustrate the example arrangements of substrate blocks in accordance with some embodiments.
Figure 28:
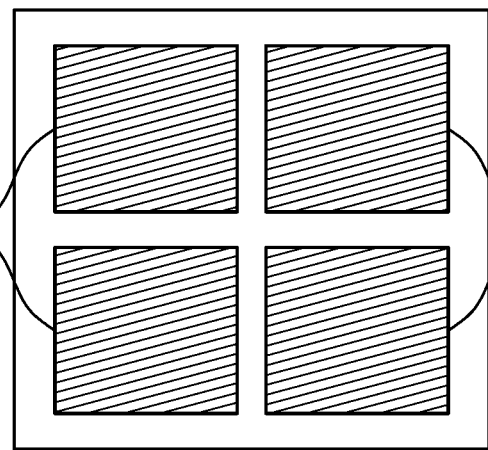

FIGS. 27 and 28 illustrate the example arrangement of substrate blocks 12 in accordance with some embodiments. FIG. 27 illustrates two substrate blocks 12. FIG. 28 illustrates four substrate blocks 12 forming an array. In accordance with some embodiments, substrate blocks 12 are closely located from each other, with no through-via (such as 26 as shown in FIG. 18) and package components (such as 28 as shown in FIG. 18) therebetween. In accordance with alternative embodiments, as shown in FIGS. 18 and 24-26, through-via 26 and possibly package components 28 may be located between neighboring substrate blocks 12.

Figure 29:
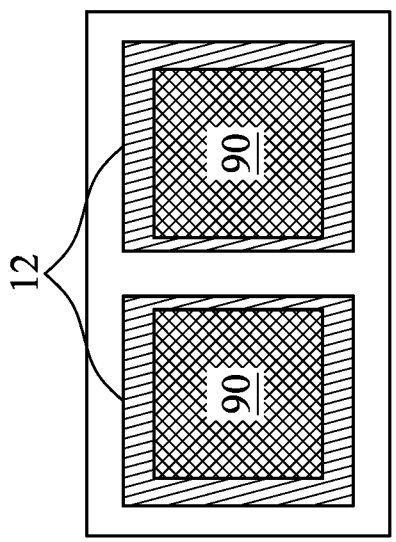
FIGS. 29 through 34 illustrate the example arrangements of substrate blocks and device dies in accordance with some embodiments.
Figure 30:
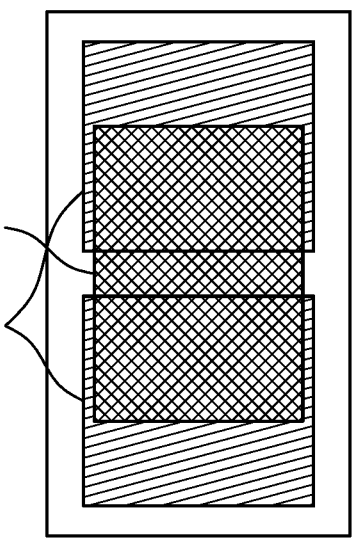

FIGS. 29 and 30 illustrate the layout of some example substrate blocks 12 and package components 90 (such as device dies) in accordance with some embodiments. In accordance with some embodiments, as shown in FIG. 29, substrate blocks 12 and package components 90 have a one-to-one correspondence, with one package component 90 overlapping one substrate blocks 12. In accordance with alternative embodiments, as shown in FIG. 30, a package component 90 may overlap, and may be electrically connected to, two or more of substrate blocks 12.

Figure 31:
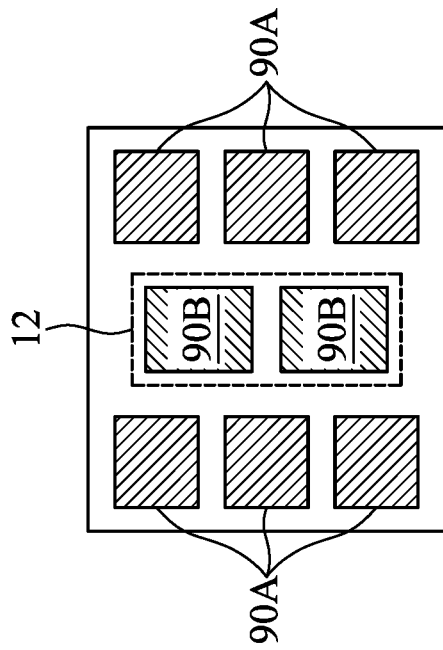

FIGS. 31 through 34 illustrate the layout of some example substrate blocks 12 and package components 90 (including 90A and 90B) in accordance with some embodiments. FIG. 31 illustrates package components 90, which include package components 90A and 90B. In accordance with some embodiments, package components 90A are device dies with lower numbers of I/O pins, and package components 90B are device dies with higher numbers of I/O pins.

Figure 33:
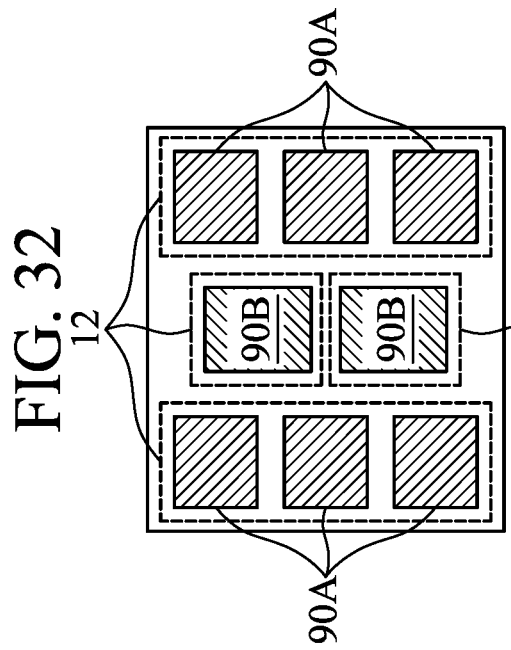
Figure 32:
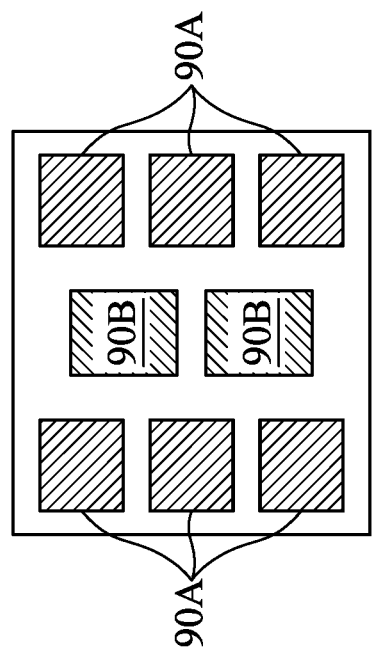
Figure 34:
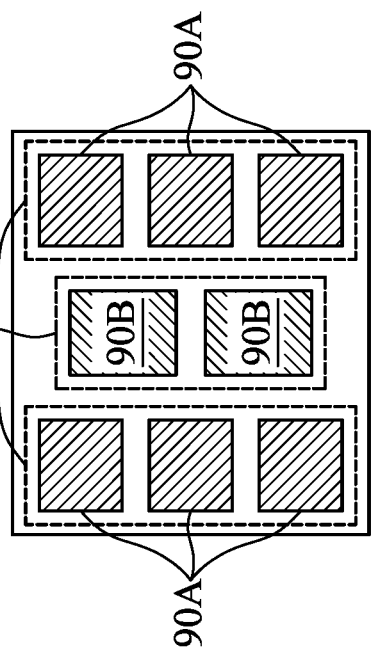

FIGS. 32 through 34 illustrate the example substrate blocks 12 laid out relative to the positions of the package components 90A and 90B. As shown in FIG. 32, substrate block 12 is underlying package components 90B, and package components 90A with lower I/O pin numbers are on opposing sides of package components 90B. In FIG. 33, three substrate blocks 12 are used, with two of the substrate blocks 12 underlying two columns of package components 90A, and one of the substrate blocks 12 underlying one column of package components 90B. In FIG. 34, four substrate blocks 12 are used, with two of the substrate blocks 12 underlying two columns of package components 90A, and two of the substrate blocks 12 having each underlying one of package components 90B.

Figure 36:
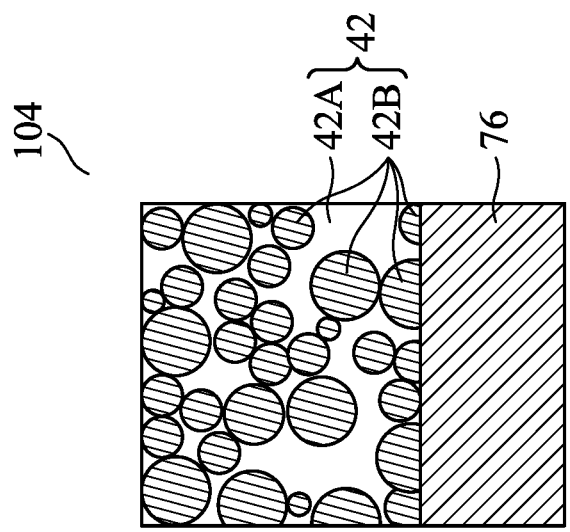
FIGS. 35 and 36 illustrate the amplified views of some portions of a package in accordance with some embodiments.
Figure 35:
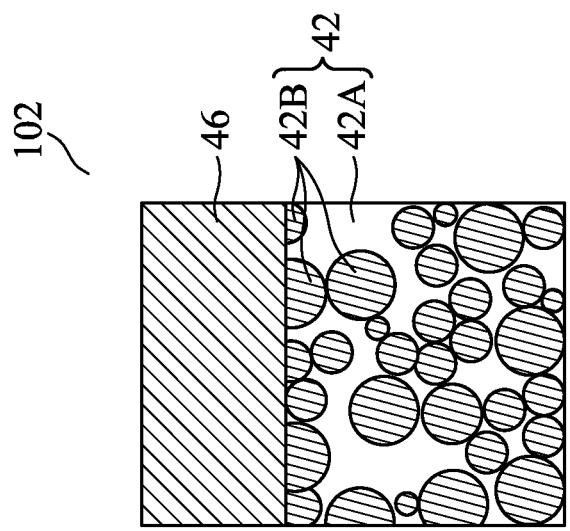

FIGS. 35 and 36 illustrate amplified views of regions 102 and 104, respectively, in FIG. 18. Region 102 is at the top surface of encapsulant 42, and region 104 is at the bottom surface of encapsulant 42. Encapsulant 42 includes base material 42A and filler particles 42B in base material 42A. Since a planarization process is performed on the top surface of encapsulant 42 during the planarization process as shown in FIG. 7, the spherical particles 42B in contact with dielectric layer 46 are partial particles that are partially polished, and have substantially planar top surfaces. The portions of encapsulant 42 in contact with dielectric layer (solder mask) 76 (or some metal pads 74) have been planarized during the process shown in FIG. 11. Accordingly, the spherical particles 42B at the bottom surface of encapsulant 42 are also partial particles that are partially polished during the planarization process, and hence will have substantially planar bottom surfaces.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By cutting large package substrates into smaller substrate blocks, and form reconstructed package substrates using the discrete substrate blocks, the otherwise severe warpage caused by the large package substrates is reduced. The yield-loss problem cause by large package substrates is reduced.

In accordance with some embodiments of the present disclosure, a method comprises forming a reconstructed package substrate comprising placing a plurality of substrate blocks over a carrier; encapsulating the plurality of substrate blocks in an encapsulant; planarizing the encapsulant and the plurality of substrate blocks to reveal redistribution lines in the plurality of substrate blocks; and forming a redistribution structure overlapping both of the plurality of substrate blocks and encapsulant; and bonding a first package component over the reconstructed package substrate. In an embodiment, the method further comprises sawing a package substrate strip into discrete substrate blocks, wherein at least one of the plurality of substrate blocks placed over the carrier is among the discrete substrate blocks. In an embodiment, two of the plurality of substrate blocks are identical to each other. In an embodiment, the plurality of substrate blocks are free from active devices and passive devices. In an embodiment, the method further comprises forming a metal post over the carrier, wherein the metal post is encapsulated in the encapsulant, and the planarizing further reveals the metal post. In an embodiment, the method further comprises de-bonding the carrier from the plurality of substrate blocks and the encapsulant; and forming a conductive feature on the reconstructed package substrate, wherein the conductive feature and the redistribution structure are electrically interconnected through the metal post. In an embodiment, the method further comprises placing an additional package component over the carrier, wherein the additional package component is encapsulated in the encapsulant, and is revealed by the planarizing, and wherein the additional package component comprises a device die or an integrated passive device. In an embodiment, the method further comprises bonding a second package component over the redistribution structure, wherein the first package component and the second package component overlap a first one and a second one, respectively, of the plurality of substrate blocks.

In accordance with some embodiments of the present disclosure, a structure comprises a reconstructed package substrate comprising a plurality of substrate blocks, each comprising a first plurality of redistribution lines therein; an encapsulant encapsulating the plurality of substrate blocks therein, wherein the plurality of substrate blocks are separated from each other by some portions of the encapsulant; a redistribution structure overlapping the plurality of substrate blocks and the encapsulant, wherein the redistribution structure comprises a second plurality of redistribution lines therein; and a plurality of conductive features underlying and electrically connected to the redistribution structure through the plurality of substrate blocks; and a first device die overlying and bonded to the reconstructed package substrate. In an embodiment, the structure further comprises a package component bonding to the plurality of conductive features, wherein the package component is overlapped by at least two of the plurality of substrate blocks. In an embodiment, the structure further comprises a through-via in the encapsulant, wherein one of the plurality of conductive features is electrically connected to the redistribution structure through the through-via. In an embodiment, the structure further comprises a package component encapsulated in the encapsulant, wherein the package component is selected from a device die and an integrated passive device, and wherein the package component comprises additional conductive features electrically connected to the redistribution structure. In an embodiment, the structure further comprises a dielectric layer underlying and contacting both of a first bottom surface of the package component and a second bottom surface of the encapsulant. In an embodiment, the plurality of substrate blocks are identical to each other. In an embodiment, the plurality of substrate blocks are free from both of active devices and passive devices. In an embodiment, the plurality of substrate blocks comprise a coreless package substrate. In an embodiment, the plurality of substrate blocks comprise a package substrate that comprises a core.

In accordance with some embodiments of the present disclosure, a structure comprises a first dielectric layer; a plurality of conductive features in the first dielectric layer; an encapsulant overlying and contacting the first dielectric layer; a plurality of substrate blocks penetrating through the encapsulant, wherein the plurality of substrate blocks are overlying and contacting the first dielectric layer; a second dielectric layer over and contacting both of the plurality of substrate blocks and the encapsulant; and a plurality of redistribution lines extending into the second dielectric layer, wherein the plurality of redistribution lines are electrically connected to the plurality of conductive features through the plurality of substrate blocks. In an embodiment, the structure further comprises a through-via penetrating through the encapsulant, wherein the through-via electrically connects one of the plurality of conductive features to one of the plurality of redistribution lines. In an embodiment, the structure further comprises a die penetrating through the encapsulant, wherein the die is electrically connected to the plurality of redistribution lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a reconstructed package substrate comprising:
      a plurality of substrate blocks, each comprising a first plurality of redistribution lines and a conductive path therein;
      an encapsulant encapsulating the plurality of substrate blocks therein, wherein the plurality of substrate blocks are separated from each other by some portions of the encapsulant, and wherein the conductive path in each of the plurality of substrate blocks extends all the way from a top surface level to a bottom surface level of the encapsulant;
      a redistribution structure overlapping the plurality of substrate blocks and the encapsulant, wherein the redistribution structure comprises a second plurality of redistribution lines therein; and
      a plurality of conductive features underlying and electrically connected to the redistribution structure through the plurality of substrate blocks; and
   a first device die overlying and bonded to the reconstructed package substrate.

2. The structure of claim 1 further comprising a package component bonding to the plurality of conductive features, wherein the package component is overlapped by at least two of the plurality of substrate blocks.

3. The structure of claim 1 further comprising a through-via in the encapsulant, wherein one of the plurality of conductive features is electrically connected to the redistribution structure through the through-via.

4. The structure of claim 1 further comprising a package component encapsulated in the encapsulant, wherein the package component is selected from a device die and an integrated passive device, and wherein the package component comprises additional conductive features electrically connected to the redistribution structure.

5. The structure of claim 4 further comprising a dielectric layer underlying and contacting both of a first bottom surface of the package component and a second bottom surface of the encapsulant.

6. The structure of claim 1, wherein the plurality of substrate blocks are identical to each other.

7. The structure of claim 1, wherein the plurality of substrate blocks are free from both of active devices and passive devices.

8. The structure of claim 1, wherein the plurality of substrate blocks comprise a coreless package substrate.

9. The structure of claim 1, wherein the plurality of substrate blocks comprise a package substrate that comprises a core.

10. A structure comprising:
    a first dielectric layer;
    a plurality of conductive features in the first dielectric layer;
    an encapsulant overlying and contacting the first dielectric layer;
    a plurality of substrate blocks penetrating through the encapsulant, wherein the plurality of substrate blocks are overlying and contacting the first dielectric layer, and wherein each of the plurality of substrate blocks comprises an electrically conductive path comprising a top end and a bottom end, and the top end is coplanar with a top surface of the encapsulant, and the bottom end is coplanar with a bottom surface of the encapsulant;
    a second dielectric layer over and contacting both of the plurality of substrate blocks and the encapsulant; and
    a plurality of redistribution lines extending into the second dielectric layer, wherein the plurality of redistribution lines are electrically connected to the plurality of conductive features through the plurality of substrate blocks.

11. The structure of claim 10 further comprising a through-via penetrating through the encapsulant, wherein the through-via electrically connects one of the plurality of conductive features to one of the plurality of redistribution lines.

12. The structure of claim 10 further comprising a die penetrating through the encapsulant, wherein the die is electrically connected to the plurality of redistribution lines.

13. The structure of claim 12, wherein the die comprises:
    a top surface and a bottom surface opposite to each other, wherein the top surface is coplanar with an additional top surface of the encapsulant, and wherein the bottom surface is coplanar with an additional bottom surface of the encapsulant.

14. The structure of claim 10, wherein each of the plurality of substrate blocks forms a vertical interface with the encapsulant.

15. The structure of claim 10, wherein two substrate blocks in the plurality of substrate blocks are identical to each other.

16. The structure of claim 10, wherein two substrate blocks in the plurality of substrate blocks have different structures.

17. A structure comprising:
    a plurality of substrate blocks, each comprising:
        a plurality of dielectric layers;
        electrical paths through the plurality of dielectric layers, wherein the electrical paths extend from a first top surface to a first bottom surface of the respective one of the plurality of substrate blocks;
    a molding compound molding the plurality of substrate blocks therein, wherein the molding compound further comprises:
        a second top surface coplanar with top ends of the electrical paths; and
        a second bottom surface coplanar with bottom ends of the electrical paths;
    a plurality of device dies over the plurality of substrate blocks; and
    a package component underlying and electrically connected to the plurality of device dies through the electrical paths in the plurality of substrate blocks.

18. The structure of claim 17, wherein the plurality of substrate blocks form vertical interfaces with the molding compound.

19. The structure of claim 17 further comprising a through-via penetrating through the molding compound.

20. The structure of claim 17 further comprising an additional package component penetrating through the molding compound.

* * * * *